(12) United States Patent
Takeshita

(10) Patent No.: US 9,774,340 B2
(45) Date of Patent: Sep. 26, 2017

(54) SEMICONDUCTOR DEVICE AND ERROR CORRECTING METHOD

(71) Applicant: LAPIS Semiconductor Co., Ltd., Yokohama (JP)

(72) Inventor: Koji Takeshita, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/259,153

(22) Filed: Sep. 8, 2016

(65) Prior Publication Data

US 2017/0070233 A1 Mar. 9, 2017

(30) Foreign Application Priority Data

Sep. 9, 2015 (JP) .................................. 2015-177297

(51) Int. Cl.
*H03M 1/06* (2006.01)
*H03M 1/08* (2006.01)
*H03M 1/36* (2006.01)

(52) U.S. Cl.
CPC .......... *H03M 1/0809* (2013.01); *H03M 1/365* (2013.01)

(58) Field of Classification Search
CPC ...... H03M 1/0809; H03M 1/365; H03M 1/06; H03M 1/1023; H03M 1/203; H03M 1/207; H03M 1/12

USPC ................................ 341/118, 120, 155, 119
See application file for complete search history.

(56) References Cited

U.S. PATENT DOCUMENTS 7,420,499 B2 * 9/2008 Sakata ................ H03M 1/1023
341/118

FOREIGN PATENT DOCUMENTS

| JP | H11-88174 A | 3/1999 |
| JP | 2003-229767 A | 8/2003 |
| JP | 2007-306302 A | 11/2007 |

\* cited by examiner

*Primary Examiner* — Jean B Jeanglaude
(74) *Attorney, Agent, or Firm* — Rabin & Berdo, P.C.

(57) ABSTRACT

A semiconductor device includes a comparison circuit that compares an input analog voltage with a plurality of reference voltages, which are arranged in an ascending order in voltage level, to thereby obtain a plurality of comparison signals arranged in an order corresponding to the order of the reference voltage, a first correction circuit that corrects each of the comparison signals using another one of the comparison signals adjacent to the each comparison signal at a first side thereof, to thereby output a plurality of first correction signals arranged in an order corresponding to the order of the comparison signals, and a second correction circuit that corrects each of the first correction signals using another one of first correction signals adjacent to the each first correction signal at a second side thereof, to thereby output a plurality of second correction signals. The second side is different from the first side.

16 Claims, 32 Drawing Sheets

FIG. 6A

A CASE IN WHICH ERROR OCCURRED IN OUPUT OF COMPARATOR C9

| COMPARATOR | E NODE | F NODE | G NODE |
| --- | --- | --- | --- |
| C31 | 0 | 0 | 0 |
| C30 | 0 | 0 | 0 |
| C29 | 0 | 0 | 0 |
| C28 | 0 | 0 | 0 |
| C27 | 0 | 0 | 0 |
| C26 | 0 | 0 | 0 |
| C25 | 0 | 0 | 0 |
| C24 | 0 | 0 | 0 |
| C23 | 0 | 0 | 0 |
| C22 | 0 | 0 | 0 |
| C21 | 0 | 0 | 0 |
| C20 | 0 | 0 | 0 |
| C19 | 0 | 0 | 0 |
| C18 | 0 | 0 | 0 |
| C17 | 0 | 0 | 0 |
| C16 | 0 | 0 | 0 |
| C15 | 0 | 0 | 0 |
| C14 | 0 | 0 | 0 |
| C13 | 0 | 0 | 0 |
| C12 | 0 | 0 | 0 |
| C11 | 0 | 0 | 0 |
| C10 | 1 | 1 | 1 |
| C9 | 0 | 0 | 1 |
| C8 | 1 | 1 | 1 |
| C7 | 1 | 1 | 1 |
| C6 | 1 | 1 | 1 |
| C5 | 1 | 1 | 1 |
| C4 | 1 | 1 | 1 |
| C3 | 1 | 1 | 1 |
| C2 | 1 | 1 | 1 |
| C1 | 1 | 1 | 1 |

FIG. 6B

BUBBLE ERROR CORRECTION
WAS PERFORMED

| ENCODING RESULT | |
|---|---|
| DECIMAL | 10 |
| BINARY | 01010 |

FIG. 7A

A CASE IN WHICH ERROR OCCURRED IN OUTPUT OF COMPARATOR C10

| COMPARATOR | E NODE | F NODE | G NODE |
|---|---|---|---|
| C31 | 0 | 0 | 0 |
| C30 | 0 | 0 | 0 |
| C29 | 0 | 0 | 0 |
| C28 | 0 | 0 | 0 |
| C27 | 0 | 0 | 0 |
| C26 | 0 | 0 | 0 |
| C25 | 0 | 0 | 0 |
| C24 | 0 | 0 | 0 |
| C23 | 0 | 0 | 0 |
| C22 | 0 | 0 | 0 |
| C21 | 0 | 0 | 0 |
| C20 | 0 | 0 | 0 |
| C19 | 0 | 0 | 0 |
| C18 | 0 | 0 | 0 |
| C17 | 0 | 0 | 0 |
| C16 | 0 | 0 | 0 |
| C15 | 0 | 0 | 0 |
| C14 | 0 | 0 | 0 |
| C13 | 0 | 0 | 0 |
| C12 | 0 | 0 | 0 |
| C11 | 0 | 0 | 0 |
| C10 | 1 | 0 | 0 |
| C9 | 0 | 0 | 0 |
| C8 | 0 | 0 | 0 |
| C7 | 1 | 1 | 1 |
| C6 | 1 | 1 | 1 |
| C5 | 1 | 1 | 1 |
| C4 | 1 | 1 | 1 |
| C3 | 1 | 1 | 1 |
| C2 | 1 | 1 | 1 |
| C1 | 1 | 1 | 1 |

FIG. 7B

BUBBLE ERROR CORRECTION
WAS PERFORMED

| ENCODING RESULT | |
|---|---|
| DECIMAL | 7 |
| BINARY | 00111 |

FIG. 7C

BUBBLE ERROR CORRECTION
WAS NOT PERFORMED

| ENCODING RESULT | |
|---|---|
| DECIMAL | 15 |
| BINARY | 01111 |

FIG. 8A

A CASE IN WHICH ERRORS OCCURRED IN OUTPUTS OF COMPARATORS C8 AND C7

| COMPARATOR | E NODE | F NODE | G NODE |
|---|---|---|---|
| C31 | 0 | 0 | 0 |
| C30 | 0 | 0 | 0 |
| C29 | 0 | 0 | 0 |
| C28 | 0 | 0 | 0 |
| C27 | 0 | 0 | 0 |
| C26 | 0 | 0 | 0 |
| C25 | 0 | 0 | 0 |
| C24 | 0 | 0 | 0 |
| C23 | 0 | 0 | 0 |
| C22 | 0 | 0 | 0 |
| C21 | 0 | 0 | 0 |
| C20 | 0 | 0 | 0 |
| C19 | 0 | 0 | 0 |
| C18 | 0 | 0 | 0 |
| C17 | 0 | 0 | 0 |
| C16 | 0 | 0 | 0 |
| C15 | 0 | 0 | 0 |
| C14 | 0 | 0 | 0 |
| C13 | 0 | 0 | 0 |
| C12 | 0 | 0 | 0 |
| C11 | 0 | 0 | 0 |
| C10 | 1 | 1 | 1 |
| C9 | 1 | 0 | 1 |
| C8 | 0 | 0 | 1 |
| C7 | 0 | 0 | 1 |
| C6 | 1 | 1 | 1 |
| C5 | 1 | 1 | 1 |
| C4 | 1 | 1 | 1 |
| C3 | 1 | 1 | 1 |
| C2 | 1 | 1 | 1 |
| C1 | 1 | 1 | 1 |

FIG. 8B

BUBBLE ERROR CORRECTION
WAS PERFORMED

| ENCODING RESULT ||
|---|---|
| DECIMAL | 10 |
| BINARY | 01010 |

FIG. 8C

BUBBLE ERROR CORRECTION
WAS NOT PERFORMED

| ENCODING RESULT ||
|---|---|
| DECIMAL | 14 |
| BINARY | 01110 |

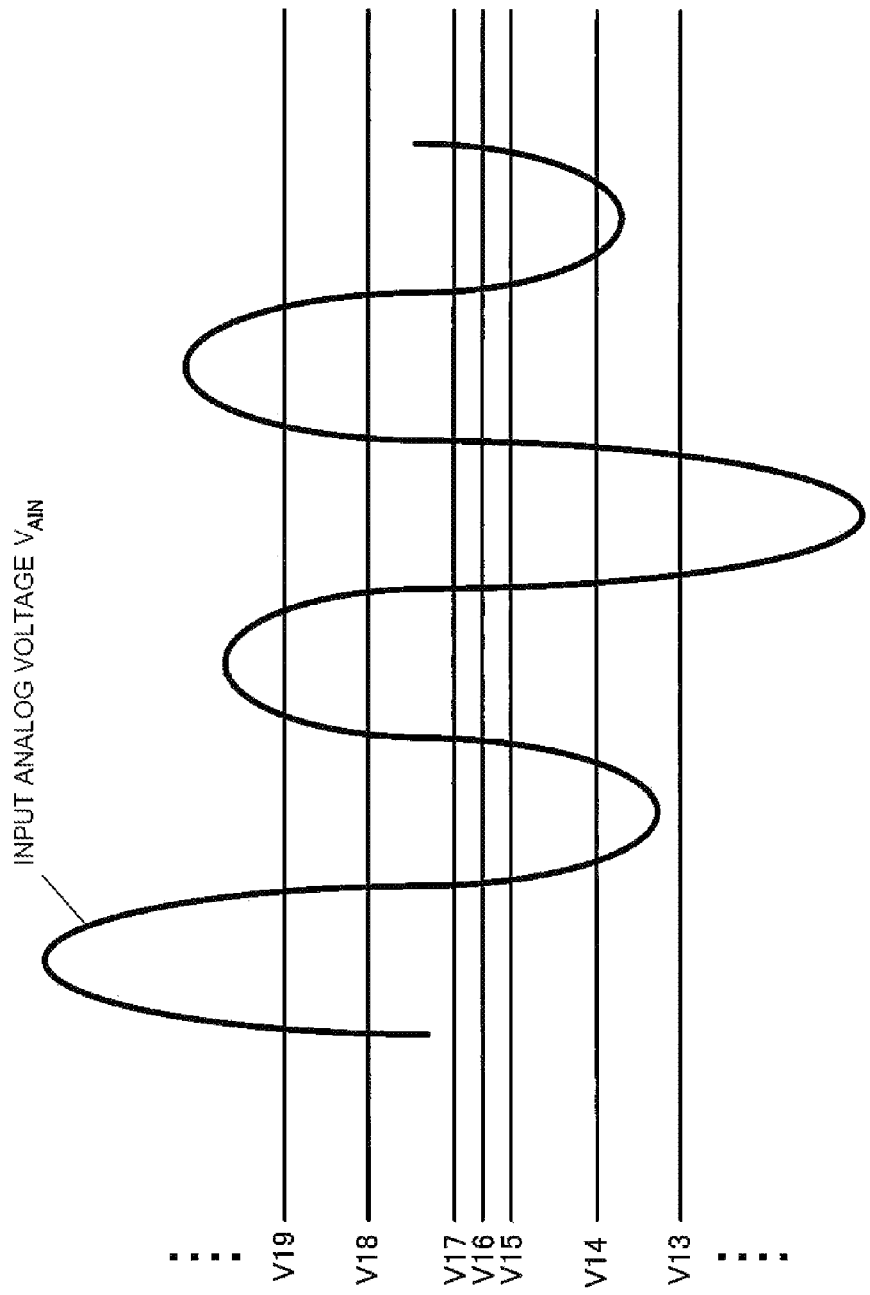

FIG. 11A

A CASE IN WHICH ERROR OCCURRED IN OUTPUTS OF COMPARATOR C17

| COMPARATOR | E NODE | F NODE | G NODE |
|---|---|---|---|
| C31 | 0 | 0 | 0 |
| C30 | 0 | 0 | 0 |
| C29 | 0 | 0 | 0 |
| C28 | 0 | 0 | 0 |
| C27 | 0 | 0 | 0 |
| C26 | 0 | 0 | 0 |
| C25 | 0 | 0 | 0 |
| C24 | 0 | 0 | 0 |
| C23 | 0 | 0 | 0 |
| C22 | 0 | 0 | 0 |
| C21 | 0 | 0 | 0 |
| C20 | 0 | 0 | 0 |
| C19 | 0 | 0 | 0 |
| C18 | 0 | 0 | 0 |
| C17 | 1 | 0 | 0 |
| C16 | 0 | 0 | 0 |
| C15 | 1 | 1 | 1 |
| C14 | 1 | 1 | 1 |
| C13 | 1 | 1 | 1 |
| C12 | 1 | 1 | 1 |
| C11 | 1 | 1 | 1 |
| C10 | 1 | 1 | 1 |
| C9 | 1 | 1 | 1 |
| C8 | 1 | 1 | 1 |
| C7 | 1 | 1 | 1 |
| C6 | 1 | 1 | 1 |
| C5 | 1 | 1 | 1 |
| C4 | 1 | 1 | 1 |
| C3 | 1 | 1 | 1 |
| C2 | 1 | 1 | 1 |
| C1 | 1 | 1 | 1 |

FIG. 11B

BUBBLE ERROR CORRECTION
WAS PERFORMED

| ENCODING RESULT | |
|---|---|
| DECIMAL | 15 |
| BINARY | 01111 |

FIG. 11C

BUBBLE ERROR CORRECTION
WAS NOT PERFORMED

| ENCODING RESULT | |
|---|---|
| DECIMAL | 31 |
| BINARY | 11111 |

FIG. 12A

A CASE IN WHICH ERROR OCCURRED IN OUTPUTS OF COMPARATOR C15

| COMPARATOR | E NODE | F NODE | G NODE |
|---|---|---|---|
| C31 | 0 | 0 | 0 |
| C30 | 0 | 0 | 0 |
| C29 | 0 | 0 | 0 |
| C28 | 0 | 0 | 0 |
| C27 | 0 | 0 | 0 |
| C26 | 0 | 0 | 0 |
| C25 | 0 | 0 | 0 |
| C24 | 0 | 0 | 0 |
| C23 | 0 | 0 | 0 |
| C22 | 0 | 0 | 0 |
| C21 | 0 | 0 | 0 |
| C20 | 0 | 0 | 0 |
| C19 | 0 | 0 | 0 |
| C18 | 0 | 0 | 0 |
| C17 | 0 | 0 | 0 |
| C16 | 1 | 1 | 1 |
| C15 | 0 | 0 | 1 |
| C14 | 1 | 1 | 1 |
| C13 | 1 | 1 | 1 |
| C12 | 1 | 1 | 1 |
| C11 | 1 | 1 | 1 |
| C10 | 1 | 1 | 1 |
| C9 | 1 | 1 | 1 |
| C8 | 1 | 1 | 1 |
| C7 | 1 | 1 | 1 |
| C6 | 1 | 1 | 1 |
| C5 | 1 | 1 | 1 |
| C4 | 1 | 1 | 1 |
| C3 | 1 | 1 | 1 |
| C2 | 1 | 1 | 1 |
| C1 | 1 | 1 | 1 |

FIG. 12B

BUBBLE ERROR CORRECTION
WAS PERFORMED

| ENCODING RESULT | |
|---|---|
| DECIMAL | 16 |
| BINARY | 10000 |

FIG. 12C

BUBBLE ERROR CORRECTION
WAS NOT PERFORMED

| ENCODING RESULT | |
|---|---|
| DECIMAL | 30 |
| BINARY | 11110 |

FIG. 20A

A CASE IN WHICH ERROR OCCURRED IN OUTPUTS OF COMPARATOR C9

| COMPARATOR | E NODE | F NODE | G NODE |
|---|---|---|---|
| C31 | 0 | 0 | 0 |
| C30 | 0 | 0 | 0 |
| C29 | 0 | 0 | 0 |
| C28 | 0 | 0 | 0 |
| C27 | 0 | 0 | 0 |
| C26 | 0 | 0 | 0 |
| C25 | 0 | 0 | 0 |
| C24 | 0 | 0 | 0 |
| C23 | 0 | 0 | 0 |
| C22 | 0 | 0 | 0 |
| C21 | 0 | 0 | 0 |
| C20 | 0 | 0 | 0 |
| C19 | 0 | 0 | 0 |
| C18 | 0 | 0 | 0 |
| C17 | 0 | 0 | 0 |
| C16 | 0 | 0 | 0 |
| C15 | 0 | 0 | 0 |
| C14 | 0 | 0 | 0 |
| C13 | 0 | 0 | 0 |
| C12 | 0 | 0 | 0 |
| C11 | 0 | 0 | 0 |
| C10 | 1 | 1 | 0 |
| C9 | 0 | 0 | 0 |
| C8 | 1 | 1 | 1 |
| C7 | 1 | 1 | 1 |
| C6 | 1 | 1 | 1 |
| C5 | 1 | 1 | 1 |
| C4 | 1 | 1 | 1 |
| C3 | 1 | 1 | 1 |
| C2 | 1 | 1 | 1 |
| C1 | 1 | 1 | 1 |

FIG. 20B

BUBBLE ERROR CORRECTION
WAS PERFORMED

| ENCODING RESULT | |
|---|---|
| DECIMAL | 8 |
| BINARY | 01000 |

FIG. 21A

A CASE IN WHICH ERROR OCCURRED IN OUTPUT OF COMPARATOR C10

| COMPARATOR | E NODE | F NODE | G NODE |
|---|---|---|---|
| C31 | 0 | 0 | 0 |
| C30 | 0 | 0 | 0 |
| C29 | 0 | 0 | 0 |
| C28 | 0 | 0 | 0 |
| C27 | 0 | 0 | 0 |
| C26 | 0 | 0 | 0 |
| C25 | 0 | 0 | 0 |
| C24 | 0 | 0 | 0 |
| C23 | 0 | 0 | 0 |
| C22 | 0 | 0 | 0 |
| C21 | 0 | 0 | 0 |
| C20 | 0 | 0 | 0 |
| C19 | 0 | 0 | 0 |
| C18 | 0 | 0 | 0 |
| C17 | 0 | 0 | 0 |
| C16 | 0 | 0 | 0 |
| C15 | 0 | 0 | 0 |
| C14 | 0 | 0 | 0 |
| C13 | 0 | 0 | 0 |
| C12 | 0 | 0 | 0 |
| C11 | 0 | 0 | 0 |
| C10 | 1 | 1 | 0 |
| C9 | 0 | 0 | 0 |
| C8 | 0 | 0 | 0 |
| C7 | 1 | 1 | 1 |
| C6 | 1 | 1 | 1 |
| C5 | 1 | 1 | 1 |
| C4 | 1 | 1 | 1 |
| C3 | 1 | 1 | 1 |
| C2 | 1 | 1 | 1 |
| C1 | 1 | 1 | 1 |

FIG. 21B

BUBBLE ERROR CORRECTION
WAS PERFORMED

| ENCODING RESULT | |
|---|---|
| DECIMAL | 7 |
| BINARY | 00111 |

FIG. 22A

A CASE IN WHICH ERRORS OCCURRED IN
OUTPUTS OF COMPARATORS C8 AND C7

| COMPARATOR | E NODE | F NODE | G NODE |
|---|---|---|---|
| C7 | 0 | 0 | 0 |
| C30 | 0 | 0 | 0 |
| C29 | 0 | 0 | 0 |
| C28 | 0 | 0 | 0 |
| C27 | 0 | 0 | 0 |
| C26 | 0 | 0 | 0 |
| C25 | 0 | 0 | 0 |
| C24 | 0 | 0 | 0 |
| C23 | 0 | 0 | 0 |
| C22 | 0 | 0 | 0 |
| C21 | 0 | 0 | 0 |
| C20 | 0 | 0 | 0 |
| C19 | 0 | 0 | 0 |
| C18 | 0 | 0 | 0 |
| C17 | 0 | 0 | 0 |
| C16 | 0 | 0 | 0 |
| C15 | 0 | 0 | 0 |
| C14 | 0 | 0 | 0 |
| C13 | 0 | 0 | 0 |
| C12 | 0 | 0 | 0 |
| C11 | 0 | 0 | 0 |
| C10 | 1 | 1 | 0 |
| C9 | 1 | 1 | 0 |
| C8 | 0 | 1 | 0 |
| C7 | 0 | 0 | 0 |
| C6 | 1 | 1 | 1 |
| C5 | 1 | 1 | 1 |
| C4 | 1 | 1 | 1 |
| C3 | 1 | 1 | 1 |
| C2 | 1 | 1 | 1 |
| C1 | 1 | 1 | 1 |

FIG. 22B

BUBBLE ERROR CORRECTION
WAS PERFORMED

| ENCODING RESULT ||
|---|---|
| DECIMAL | 6 |
| BINARY | 00110 |

SEMICONDUCTOR DEVICE AND ERROR CORRECTING METHOD

BACKGROUND OF THE INVENTION

Technical Field

The present invention relates to a semiconductor device, and particularly to a semiconductor device that forms an analog-digital converter circuit.

Background Art

There are various types of analog-digital converter circuits (hereinafter referred to as "A/D converter circuits"), which are often classified into the parallel comparator type, the pipeline type, the sequential comparator type, and the delta-sigma type. Such types are selected according to the required sampling rate and resolution.

If, for example, a parallel comparator type A/D converter circuit, including a plurality of comparators that compare a plurality of reference voltages outputted by a resistor voltage divider with an input analog voltage, has a required resolution of n bits, then in general, there need to be $2^n-1$ comparators. If the required resolution is 10 bits, for example, then this would mean that 1023 comparators are needed, which increases the scale of the circuit.

The following technique for reducing the scale of a parallel comparator type A/D converter circuit is known, for example. Japanese Patent Application Laid-Open Publication No. 2003-229767, for example, discloses an A/D converter circuit including: a reference voltage source that generates a plurality of reference voltages; a plurality of comparators that are each provided so as to receive exclusive input of one of the plurality of reference voltages, the comparators comparing the inputted reference voltages with analog input; and an encoder that determines the voltage range where the analog input is present from among a plurality of voltage ranges in which the analog input might be present, on the basis of the output from the plurality of comparators, and digitally outputs the corresponding code. In such an A/D converter circuit, the operation of comparators corresponding to voltage regions that have a lower probability of the analog input being present therein than other voltage regions, among all voltage regions, is stopped, and such regions are designated as low resolution regions having a lower resolution than the other voltage regions.

Also, typical parallel comparator A/D converter circuits use a thermometer code. Bubble errors can occur in thermometer code due to offset variation in the comparator or the like. Thus, a circuit for correcting bubble errors is sometimes provided in A/D converter circuits. The following technique for correcting bubble errors is known.

Japanese Patent Application Laid-Open Publication No. H11-88174, for example, discloses an A/D converter circuit having an encoder including: an encoder circuit that detects a logical boundary in a thermometer code, thereby generating a gray code digital signal; and a gray/binary conversion circuit that converts the gray code outputted from the encoder circuit to a binary code digital signal. The encoder circuit includes: an error detection circuit that detects whether or not there is a specific relationship between the lower bit and the upper bit of the gray code, thereby detecting an error code included in the gray code; and an error correction circuit that corrects the error code detected by the error detection circuit.

Also, Japanese Patent Application Laid-Open Publication No. 2007-306302 discloses an A/D converter circuit having a digital averaging circuit that corrects errors in output results from the comparator by majority logic, a logical boundary detection circuit that detects the location of change in data outputted from the digital averaging circuit, and an encoder circuit that converts the data to binary code according to the output from the logical boundary detection circuit.

SUMMARY OF THE INVENTION

A well-formed thermometer code has a series of 0's and 1's such as "11100000", with one logical boundary between the "0" and the "1". However, if a bubble error occurs in the thermometer code, the 0's and 1's become discontinuous as in "11101000", for example, resulting in a plurality of logical boundaries appearing. In this manner, there are many cases in which the digital value attained by encoding a thermometer code having a plurality of logical boundaries greatly diverges from the true value. In such a case, an unexpected signal value is inputted in an electronic device that operates on the basis of a digital signal outputted from the A/D converter circuit, resulting in erroneous operation.

While the A/D converter circuits disclosed in Japanese Patent Application Laid-Open Publication No. H11-88174 and Japanese Patent Application Laid-Open Publication No. 2007-306302 have a means for correcting bubble errors, they cannot correct bubble errors in which there are two or more 0's (bubbles) between 1's such as in "1100100" (that is, bubble errors having multiple bubble bits). While the most common type of bubble error is one in which one 0 is present between 1's, it is preferable that the A/D converter circuit be able to handle bubble errors where two or more 0's are present between the 1's from the perspective of providing a high degree of reliability.

The present invention takes into account the above-mentioned points, and an object thereof is to provide a semiconductor device by which the range of bubble error correction can be expanded with ease.

A semiconductor device according to an aspect of the invention includes a comparison circuit configured to compare an input analog voltage with a plurality of reference voltages, which are arranged in an ascending order in voltage level, to thereby obtain a plurality of comparison signals arranged in an order corresponding to the order of the reference voltage, a first correction circuit configured to correct each of the comparison signals using another one of the comparison signals that is adjacent to the each comparison signal at a first side thereof, to thereby output a plurality of first correction signals arranged in an order corresponding to the order of the comparison signals, and a second correction circuit configured to correct each of the first correction signals using another one of first correction signals that is adjacent to the each first correction signal at a second side thereof, to thereby output a plurality of second correction signals, the second side being different from the first side.

An error correcting method according to an aspect of the invention includes comparing an input analog voltage with a plurality of reference voltages, which are arranged in an ascending order in voltage level, to thereby obtain a plurality of comparison signals arranged in an order corresponding to the order of the reference voltage, performing first correction on each of the comparison signals using another one of the comparison signals that is adjacent to the each comparison signal at a first side thereof, to thereby output a plurality of first correction signals arranged in an order corresponding to the order of the comparison signals, and performing second correction on each of the first correction signals using another one of first correction signals that is adjacent to the each first correction signal at a second side thereof, to thereby output a plurality of second correction signals, the second side being different from the first side.

According to the present invention, a semiconductor device by which the range of bubble error correction can be expanded with ease is provided.

BRIEF DESCRIPTION OF THE DRAWINGS

FIG. 6A shows an aspect of error correction by the bubble error correction circuit according to an embodiment of the present invention. FIG. 6B shows the result of encoding a thermometer code corrected by the bubble error correction circuit according to an embodiment of the present invention.

FIG. 7A shows an aspect of error correction by the bubble error correction circuit according to an embodiment of the present invention. FIG. 7B shows the result of encoding a thermometer code in which a bubble error was corrected by the bubble error correction circuit according to an embodiment of the present invention. FIG. 7C shows the result of encoding a thermometer code in which a bubble error has not been corrected.

FIG. 8A shows an aspect of error correction by the bubble error correction circuit according to an embodiment of the present invention. FIG. 8B shows the result of encoding a thermometer code in which a bubble error was corrected by the bubble error correction circuit according to an embodiment of the present invention. FIG. 8C shows the result of encoding a thermometer code in which a bubble error has not been corrected.

FIG. 9 shows an example of a relationship between a plurality of reference voltages outputted from a reference voltage generation circuit according to an embodiment of the present invention, and an input analog voltage.

FIG. 11A shows an aspect of error correction by the bubble error correction circuit according to an embodiment of the present invention. FIG. 11B shows the result of encoding a thermometer code in which a bubble error was corrected by the bubble error correction circuit according to an embodiment of the present invention. FIG. 11C shows the result of encoding a thermometer code in which a bubble error has not been corrected.

FIG. 12A shows an aspect of error correction by the bubble error correction circuit according to an embodiment of the present invention. FIG. 12B shows the result of encoding a thermometer code in which a bubble error was corrected by the bubble error correction circuit according to an embodiment of the present invention. FIG. 12C shows the result of encoding a thermometer code in which a bubble error has not been corrected.

FIG. 20A shows an aspect of error correction by the bubble error correction circuit according to an embodiment of the present invention. FIG. 20B shows the result of encoding a thermometer code corrected by the bubble error correction circuit according to an embodiment of the present invention.

FIG. 21A shows an aspect of error correction by the bubble error correction circuit according to an embodiment of the present invention. FIG. 21B shows the result of encoding a thermometer code corrected by the bubble error correction circuit according to an embodiment of the present invention.

FIG. 22A shows an aspect of error correction by the bubble error correction circuit according to an embodiment of the present invention. FIG. 22B shows the result of encoding a thermometer code corrected by the bubble error correction circuit according to an embodiment of the present invention.

DETAILED DESCRIPTION OF THE INVENTION

Figure 1:
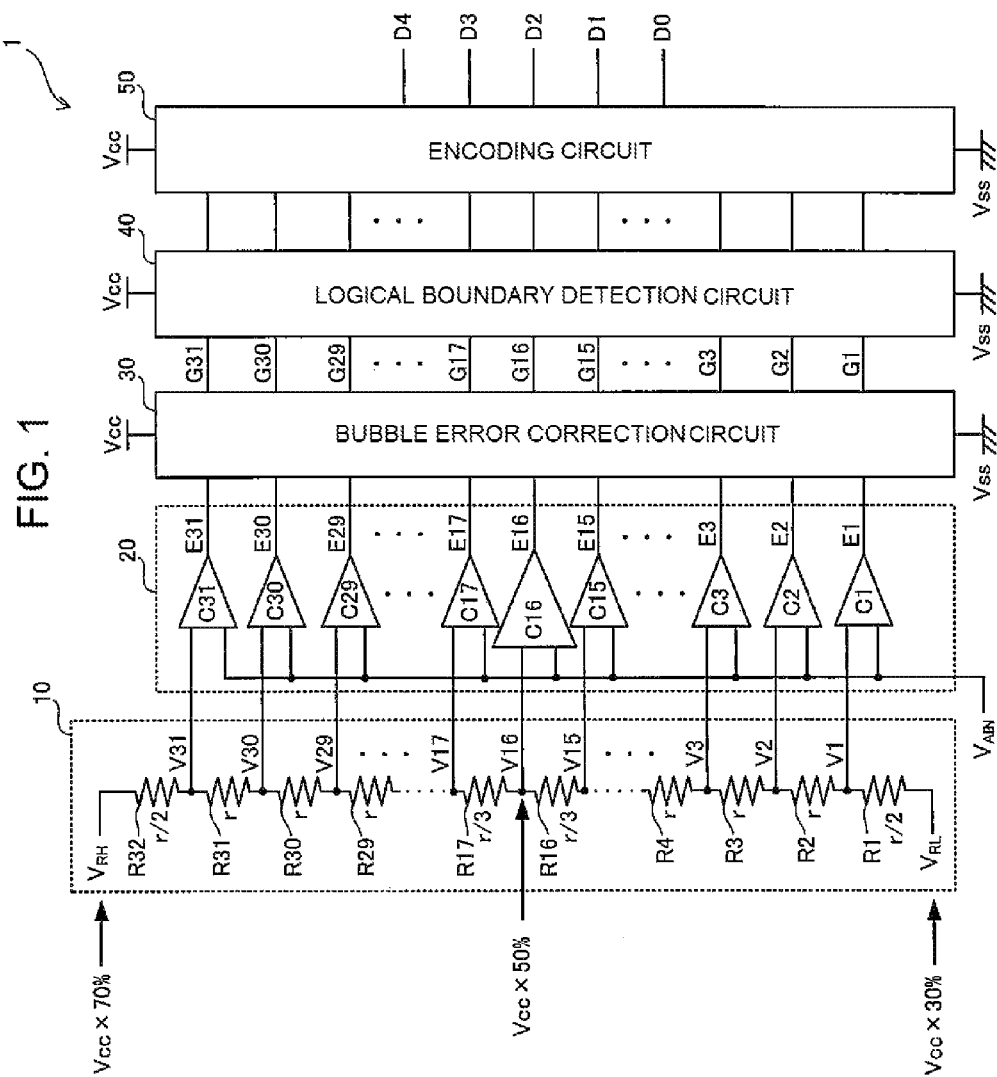
FIG. 1 shows a circuit configuration of a semiconductor device according to an embodiment of the present invention.
Figure 2:
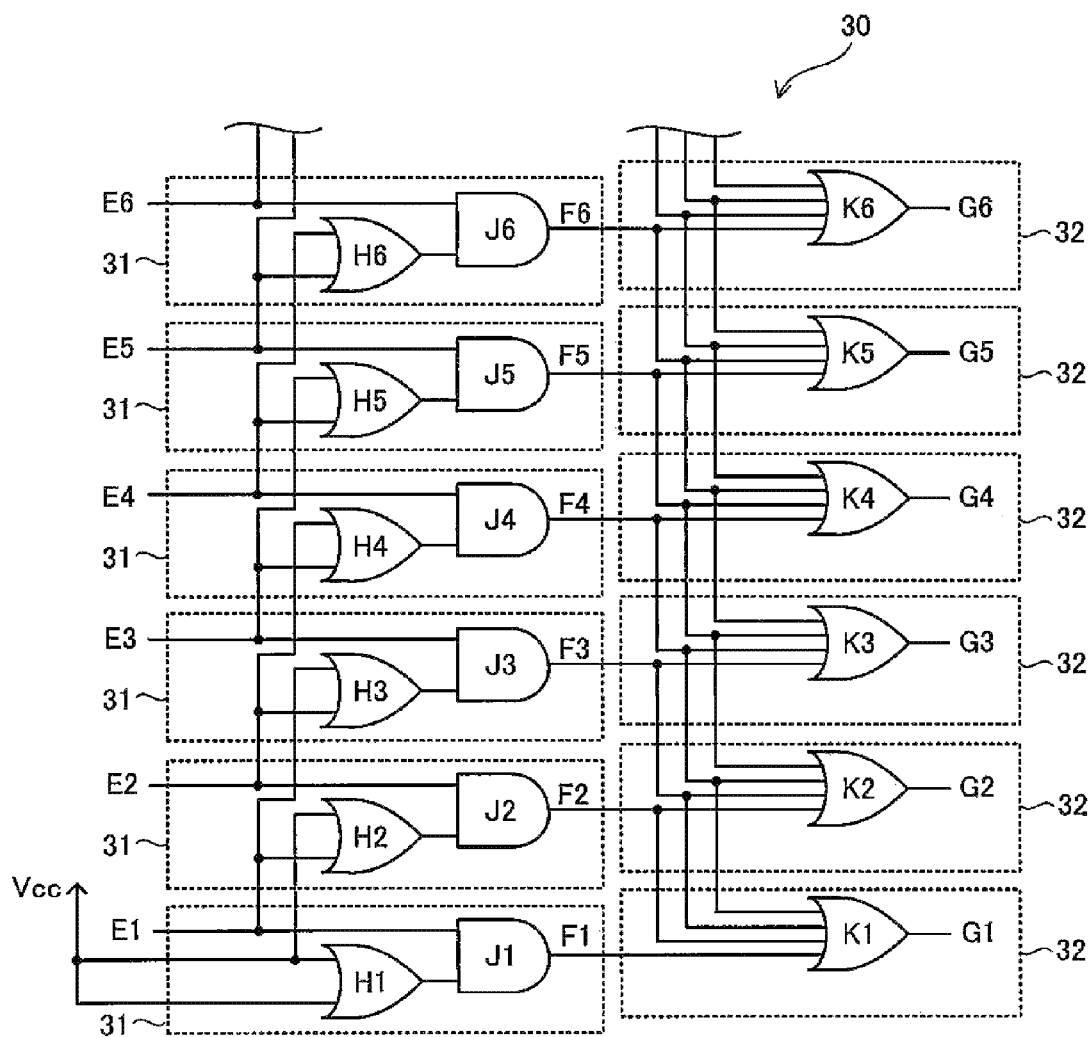
FIG. 2 is an equivalent circuit diagram of a bubble error correction circuit according to an embodiment of the present invention.
Figure 3:
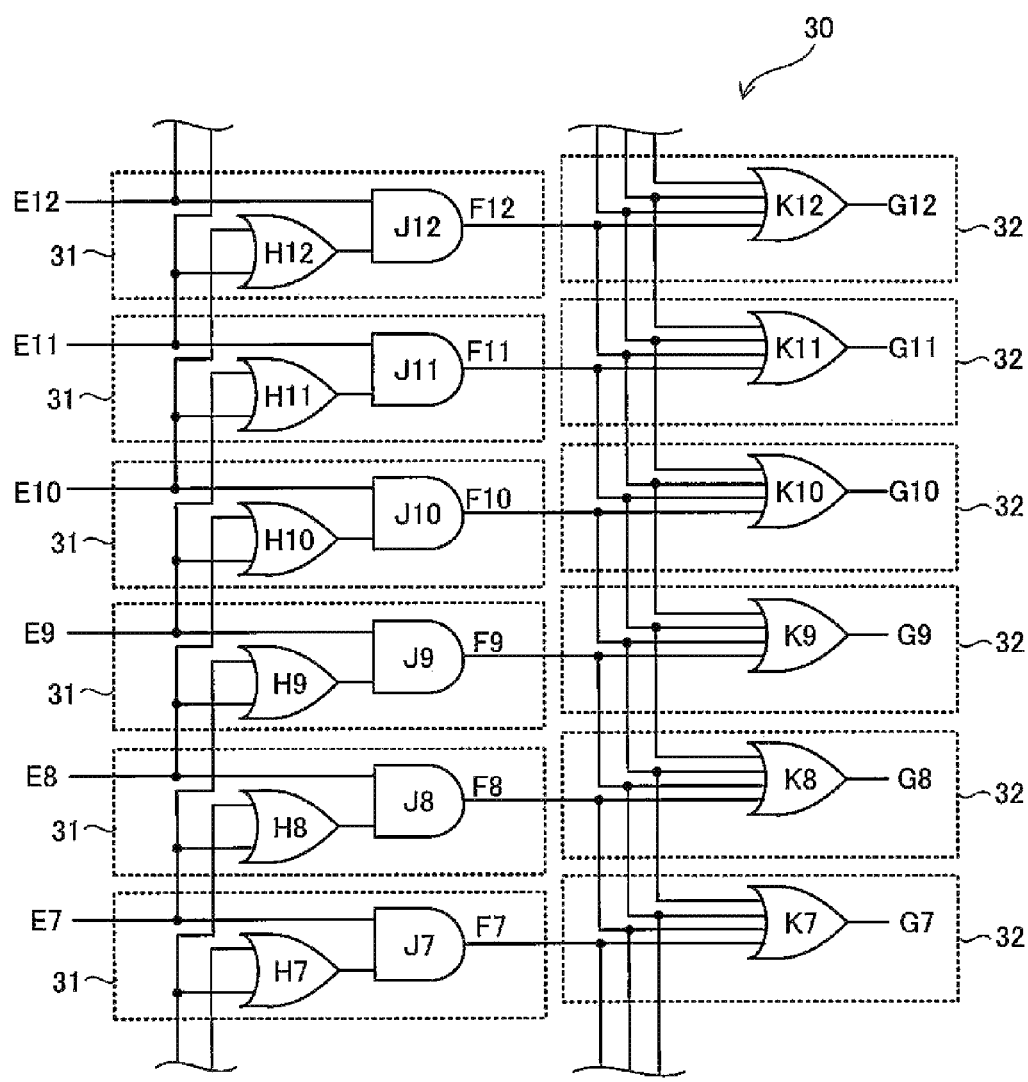
FIG. 3 is an equivalent circuit diagram of a bubble error correction circuit according to an embodiment of the present invention.

Examples of embodiments of the present invention will be explained below with reference to the drawings. The same or equivalent components and portions in the drawings are assigned the same reference characters and redundant explanations thereof will be omitted.

<Embodiment 1>

FIG. 1 shows a circuit configuration of a semiconductor device 1 according to an embodiment of the present invention. The semiconductor device 1 constitutes a parallel comparator type A/D converter circuit having a 5-bit resolution as an example. That is, the semiconductor device 1 outputs a 5-bit binary code (D0, D1, D2, D3, D4) according to the size of an input analog voltage $V_{AIN}$. The semiconductor device 1 includes a reference voltage generation circuit 10, a comparison circuit 20, a bubble error correction circuit 30, a logical boundary detection circuit 40, and an encoding circuit 50.

The reference voltage generation circuit 10 includes 32 resistors R1 to R32 connected in series. In the present embodiment, the resistance of the resistors R1 and R32 is r/2, the resistance of the resistors R16 and R17 is r/3, and the resistance of the other resistors R2 to R15 and R18 to R31 is r. The reference voltage generation circuit 10 performs voltage division on a difference between a voltage $V_{RL}$ on a low potential side that is applied to one terminal of the resistor R1 and a voltage $V_{RH}$ on a high potential side that is applied to one terminal of the resistor R32, according to a voltage division ratio based on the resistance of the resistors, and outputs reference voltages V1 to V31 from respective connective points between adjacent resistors.

In the present embodiment, as an example, a reference voltage of 30% of a power source voltage Vcc and a reference voltage of 70% of the power source voltage Vcc are supplied, respectively, to the voltage $V_{RL}$ and the voltage $V_{RH}$ such that the voltage outputted from the connective point between the resistor R1 and the resistor R2 attains a reference voltage V1 with the lowest voltage level, and the voltage outputted from the connective point between the resistor R31 and the resistor R32 attains a reference voltage V31 with the highest voltage level. The reference voltage V16 outputted from the connective point between the resistor R16 and the resistor R17 is 50% of the power source voltage Vcc. As described above, the resistance r/3 of the resistors R16 and R17 is less than the resistance r of the other resistors R2 to R5 and R18 to R31, and thus, the difference between the reference voltages V15 and V16 and the difference between the reference voltages V16 and V17 are less than the differences between other adjacent reference voltages. That is, the reference voltage generation circuit 10 generates a plurality of reference voltages such that regions with a relatively large difference (first difference) in adjacent reference voltages (first reference voltages) and regions with a relative small difference (second difference) in another adjacent reference voltages (second reference voltages) are present. The resistance ratios between the resistors R1 to R32 are not limited to what was described above, and can be modified appropriately. The reference voltages supplied to the voltage $V_{RL}$ and the voltage $V_{RH}$ can also be appropriately modified.

The comparison circuit 20 includes 31 comparators C1 to C31 corresponding to the reference voltages V1 to V31 outputted from the reference voltage generation circuit 10. Of the reference voltages V1 to V31 outputted from the reference voltage generation circuit 10, those that correspond to each of the comparators C1 to C31 are inputted to one input terminal, and an input analog voltage $V_{AIN}$ is inputted to the other input terminal. The comparators C1 to C31 each compare the corresponding reference voltage among the reference voltages V1 to V31 with the input analog voltage $V_{AIN}$ and outputs comparison results as comparison signals E1 to E31. For example, the comparator C3 compares the input analog voltage $V_{AIN}$ with the reference voltage V3, and if the input analog voltage $V_{AIN}$ is greater than the reference voltage V3, outputs a comparison signal E3 with a logic value of 1, whereas if the input analog voltage $V_{AIN}$ is less than the reference voltage V3, the comparator C3 outputs a comparison signal E3 with a logic value of 0. The thermometer code is constituted of the comparison signals E1 to E31 outputted respectively from the comparators C1 to C31.

In the present embodiment, the comparator C16, which compares the input analog voltage $V_{AIN}$ with the reference voltage V16, is a high sensitivity comparator with a higher sensitivity than the other comparators C1 to C15 and C17 to C31. Here, high sensitivity for a comparator means that even if the difference between the reference voltage and the input analog voltage $V_{AIN}$ is small, it is still possible to output comparison results indicating the size relationship therebetween. If, for example, a normal sensitivity comparator other than the comparator C16 can output comparison results for differences of tens of mV between the reference voltage and the input analog voltage $V_{AIN}$, the high sensitivity comparator C16 can output comparison results for differences of a few mV between the reference voltage and the input analog voltage $V_{AIN}$. The high sensitivity comparator has more transistors than normal sensitivity comparators, and includes a plurality of stages of differential amplifiers.

The bubble error correction circuit 30 corrects bubble errors that occur in thermometer code constituted of the comparison signals E1 to E31 supplied from the comparison circuit 20 and supplies corrected signals G1 to G31 to the logical boundary detection circuit 40. The detailed configuration of the bubble error correction circuit 30 will be described later.

The logical boundary detection circuit 40 detects logical boundaries (boundaries between the 1's and 0's) in the corrected thermometer code constituted of the signals G1 to G31 supplied from the bubble error correction circuit 30. The logical boundary detection circuit 40 compares two bits adjacent to each other in the thermometer code, and outputs "1", for example, as a bit corresponding to the logical boundary in the thermometer code, while outputting "0" for other bits. The logical boundary detection circuit 40 outputs " . . . 0001000 . . . " for a thermometer code of " . . . 1111000 . . . ", for example.

The encoding circuit 50 outputs 5-bit output signals (D0, D1, D2, D3) where the thermometer code was converted to binary code on the basis of the output signal from the logical boundary detection circuit 40. The bubble error correction circuit 30, the logical boundary detection circuit 40, and the encoding circuit 50 are, respectively, connected to a ground line to which a ground voltage Vss is supplied and to a power source line to which the power source voltage Vcc is supplied, and the power source voltage Vcc operates as a drive voltage.

FIGS. 2 to 5 are equivalent circuit diagrams of a bubble error correction circuit 30 according to Embodiment 1. The bubble error correction circuit 30 includes 2-input OR (logical disjunction or OR operation) circuits H1 to H31, 2-input AND (logical conjunction or AND operation) circuits J1 to J31, and 4-input OR circuits K1 to K31, which are respectively provided so as to correspond with the comparators C1 to C31 constituting the comparison circuit 20.

One input terminal of each of the AND circuits J1 to J31 is connected to the output terminal of each of the corresponding comparators C1 to C31, and receives as input the corresponding comparison signal E1 to E31. The other input terminal of each of the AND circuits J1 to J31 is connected to the output terminal of each of the corresponding OR circuits H1 to H31, and receives as input the output signal of the corresponding OR circuit. A comparison signal E3 outputted from the corresponding comparator C3 is inputted to one input terminal of the AND circuit J3, and an output signal from the corresponding OR circuit H3 is inputted to the other input terminal of the AND circuit J3, for example.

One input terminal of each of the OR circuits H3 to H31 is connected to the output terminal of each of the comparators disposed one step lower than the corresponding comparators C3 to C31, and receives as input the comparison signal outputted from the comparator disposed one step lower. In other words, the comparison signals are arranged in an ascending order in voltage level. The other input terminal of each of the OR circuits H3 to H31 is connected to the output terminal of each of the comparators disposed two steps lower than the corresponding comparators C3 to C31, and receives as input the comparison signal outputted from the comparator disposed two steps lower. The comparison signal E2 outputted from the corresponding comparator C2 is inputted to the one input terminal of the OR circuit H3, the comparator C2 being disposed one step lower than the corresponding comparator C3. The other input terminal of the OR circuit H3 receives as input the comparison signal E1 outputted from the comparator C1 disposed two steps lower than the corresponding comparator C3, for example. "Comparator disposed at a lower step (side)" refers to a comparator receiving as input a lower reference voltage.

The comparison signal E1 outputted from the comparator C1 is inputted to the one input terminal of the OR circuit H2, the comparator C1 being disposed one step lower than the corresponding comparator C2. The other input terminal receives as input the power source voltage Vcc (logic level of "1"). In the OR circuit H1, the power source voltage Vcc (logic level of "1") is inputted to both input terminals.

Figure 4:
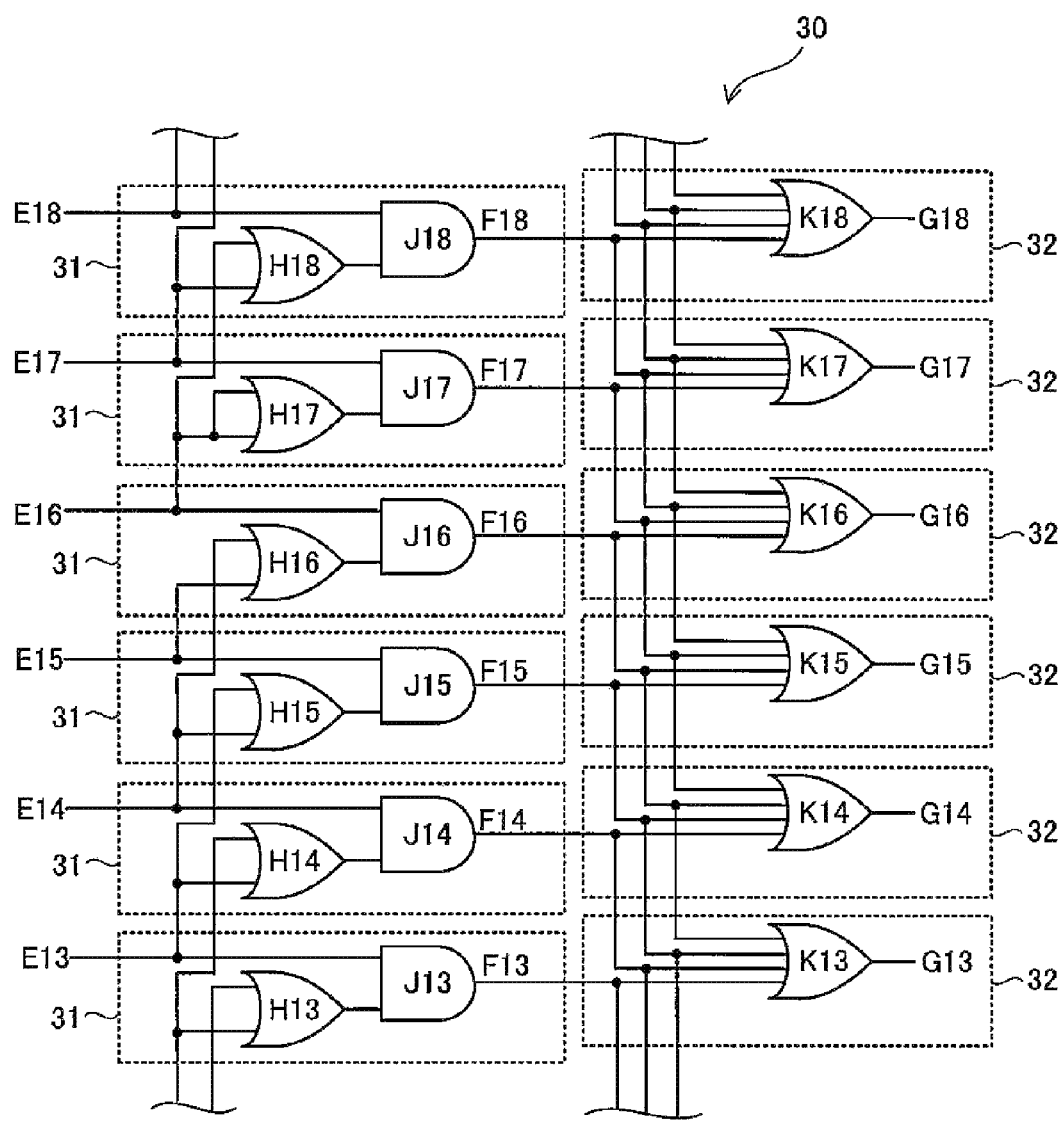
FIG. 4 is an equivalent circuit diagram of a bubble error correction circuit according to an embodiment of the present invention.
Figure 5:
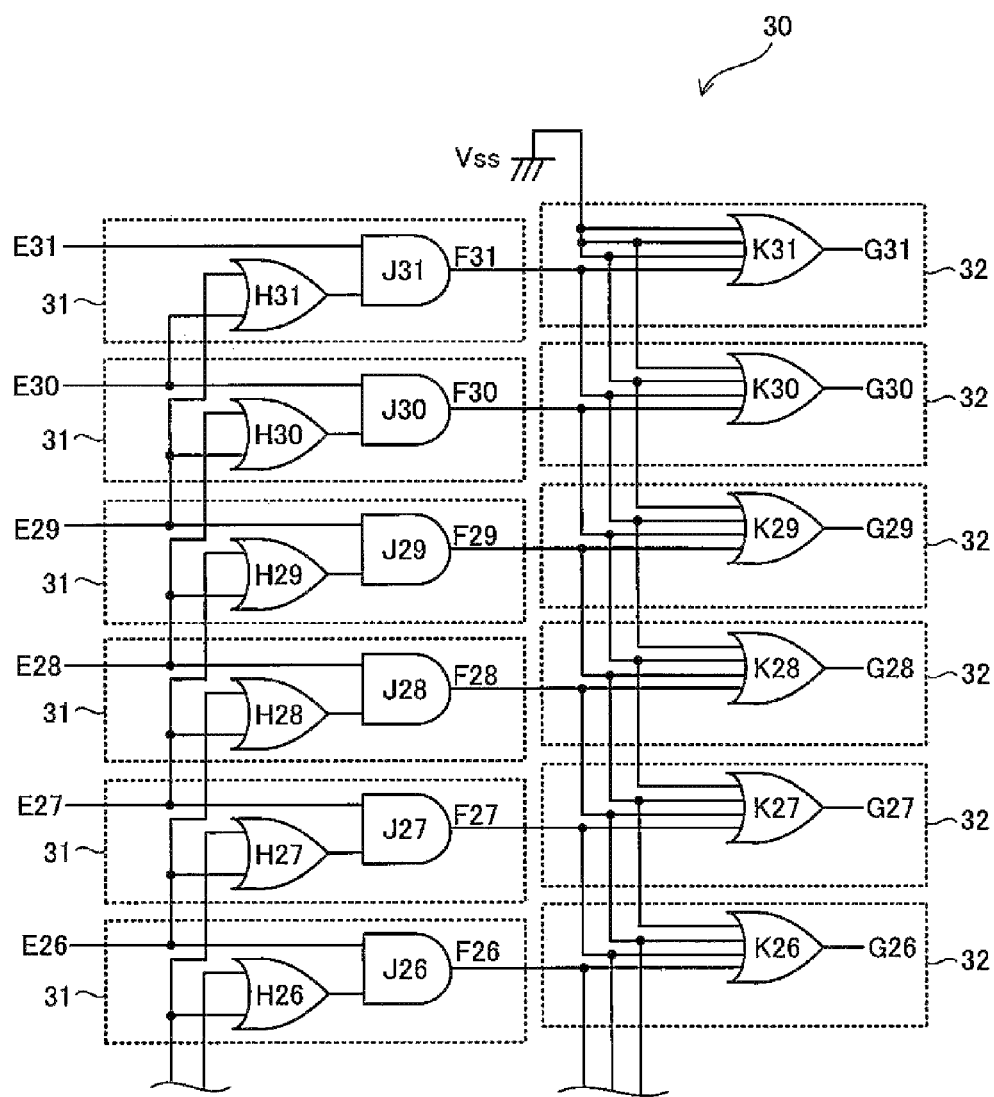
FIG. 5 is an equivalent circuit diagram of a bubble error correction circuit according to an embodiment of the present invention.

As shown in FIG. 4, in the bubble error correction circuit 30 of the present embodiment, both of the input terminals of the OR circuit H17 are connected to the output terminal of the comparator C16 disposed one step lower, which is an exceptional connective configuration. A configuration may be adopted in which the OR circuit H17 is omitted, with the comparison signal E17 being inputted to one input terminal of the AND circuit J17 and the comparison signal E16 being directly inputted to the other input terminal of the AND circuit J17.

One input terminal of each of the OR circuits K1 to K28 is connected to the output terminal of each of the corresponding AND circuits J1 to J28, and receives as input the output signal F1 to F28 outputted from the corresponding AND circuit. The other three input terminals of each of the OR circuits K1 to K28 are connected to the output terminal of each of the AND circuits disposed one to three steps above the corresponding AND circuits J1 to J28, and receive as input the output signals outputted from the three AND circuits disposed in higher steps. One input terminal of the OR circuit K3 receives as input the output signal F3 outputted from the corresponding AND circuit J3, and the other three input terminals receive as input the output signals F4, F5, and F6 outputted respectively from the AND circuits J4, J5, and J6 disposed one to three steps above the corresponding AND circuit J3, for example.

One input terminal of the OR circuit K29 receives as input the output signal F29 outputted from the corresponding AND circuit J29, other two input terminals receive as input the output signals F30 and F31 outputted respectively from the AND circuits J30 and J31 disposed above the corresponding AND circuit J29, and the remaining one input terminal receives as input the ground voltage Vss (logic level "0").

One input terminal of the OR circuit K30 receives as input the output signal F30 outputted from the corresponding AND circuit J30, another one input terminal receives as input the output signal F31 outputted from the AND circuit J31 disposed above the corresponding AND circuit J30, and the remaining two input terminals receive as input the ground voltage Vss (logic level "0").

One input terminal of the OR circuit K31 receives as input the output signal F31 outputted from the corresponding AND circuit J31, and the remaining three input terminals receive as input the ground voltage Vss (logic level "0").

"AND circuit disposed at a higher step" refers to an AND circuit that receives as input a comparison signal from a comparator receiving as input a higher reference voltage.

Below, the functions and operations of the bubble error correction circuit 30 will be described. Errors occurring in the comparison signals E1 to E31 outputted by the comparators C1 to C31 are, respectively, corrected by a first correction circuit 31 including corresponding OR circuits H1 to H31 and corresponding AND circuits J1 to J31, and the result of correction is outputted as output signals F1 to F31 of the AND circuits J1 to J31. Below, the output signals F1 to F31 of the AND circuits J1 to J31 are referred to as first correction signals F1 to F31.

The first correction signals F1 to F31 are, respectively, further corrected by a second correction circuit 32 including corresponding latter stage OR circuits K1 to K31, and the result of correction is outputted as output signals G1 to G31 of the OR circuits K1 to K31. Below, the output signals G1 to G31 of the OR circuits K1 to K31 are referred to as second correction signals G1 to G31. The second correction signals G1 to G31 are supplied to the logical boundary detection circuit 40 as a corrected thermometer code. Errors occurring in the comparison signal E3 outputted by the comparator C3 are corrected by the first correction circuit 31 including the corresponding OR circuit H3 and the corresponding AND circuit J3, and the first correction signal F3 is generated. The first correction signal F3 is further corrected by the second correction circuit 32 including the OR circuit K3, and the second correction signal G3 is generated.

The first correction circuit 31 of the present embodiment corrects errors occurring in the comparison signals E1 to E31 using the comparison signal one step below the corresponding comparison signal and the comparison signal two steps below the corresponding comparison signal. More specifically, if the comparison signal to be corrected has a value of "1", and the comparison signals one and two steps below the comparison signal to be corrected both have a value of "0", then the first correction circuit 31 corrects the comparison signal to be corrected to "0". The first correction circuit 31 otherwise does not correct the value of the comparison signal to be corrected. If the comparison signal E3 to be corrected has a value of "1", and the comparison signals E2 and E1, which are respectively one and two steps below the comparison signal to be corrected, both have a value of "0", then the first correction circuit 31, which performs error correction on the comparison signal E3, corrects the value of the comparison signal E3 to be corrected from "1" to "0", for example. "Comparison signal at a lower step" refers to a comparison signal outputted by a comparator receiving as input a lower reference voltage.

In the present embodiment, correction of the comparison signal E17 is performed in an exceptional manner. As shown in FIG. 4, the two input terminals of the OR circuit H17 constituting the first correction circuit 31, which performs error correction on the comparison signal E17, are both connected to the output terminal of the comparator C16. According to this configuration, if the comparison signal E17 has a value of "1" but the comparison signal E16 has a value of "0", then the value of the comparison signal E17 is corrected to "0". That is, the comparison signal E16 is prioritized over the comparison signal E17. As described in the present embodiment, the comparator C16 is a high sensitivity comparator with a higher sensitivity than other comparators, which means that the probability of an error occurring is relatively low and the reliability of the comparison signal E16 is relatively high. Thus, by prioritizing the comparison signal E16 over the comparison signal E17, it is possible to increase the degree to which the relatively high reliability comparison signal E16 contributes to error correction, allowing for higher accuracy correction.

The second correction circuit 32 of the present embodiment corrects the first correction signal to be corrected using the first correction signals one to three steps above the corresponding first correction signal. More specifically, if the first correction signal to be corrected has a value of "0", and at least one of the first correction signals one to three steps above the first correction signal to be corrected has a value of "1", then the second correction circuit 32 corrects the value of the first correction signal to be corrected from "0" to "1". If the first correction signal F3 to be corrected has a value of "0", and at least one of the first correction signals F4 to F6 one to three steps above the first correction signal F3 to be corrected has a value of "1", then the second correction circuit 32, which performs error correction on the first correction signal F3, corrects the value of the first correction signal F3 to be corrected to "1", for example. "First correction signal at a higher step" refers to a first correction signal for a comparison signal outputted by a comparator receiving as input a higher reference voltage.

Below, the functions and operations of the bubble error correction circuit 30 of the present embodiment will be described with reference to specific cases shown in FIGS. 6 to 8.

FIG. 6A shows the signal values of nodes for a case in which the value of the comparison signals E1 to E8 and E10 outputted by the comparators C1 to C8 and C10 is "1", the value of the comparison signals E11 to E31 outputted from the comparators C11 to C31 is "0", and the value of the comparison signal E9 outputted by the comparator C9 is "0" due to an error. The E nodes in FIG. 6A are output terminal nodes of the comparators C1 to C31, the F nodes are output terminal nodes (output nodes of the first correction circuit 31) of the AND circuits J1 to J31, and the G nodes are output terminal nodes (output nodes of the second correction circuit 32) of the OR circuits K1 to K31 (this similarly applies to FIGS. 7A and 8A).

The value of the comparison signal E9 is "0", and thus, the first correction circuit 31 including the OR circuit H9 and the AND circuit J9 do not correct the value of the comparison signal E9 by comparison signals at a lower step than the comparison signal E9. Thus, the value of the first correction signal F9 outputted to the F node is "0". Meanwhile, the value of the comparison signal E8 two steps below the comparison signal E10 is "1", and thus, the first correction circuit 31 including the OR circuit H10 and the AND circuit J10 does not correct the value of the comparison signal E10. Thus, the value of the first correction signal F10 outputted to the F node is "1".

Because the first correction signal F10, which is one step above the first correction signal F9, has a value of "1", the second correction circuit 32 including the OR circuit K9 corrects the value of the first correction signal F9 from "0" to "1", and outputs this to the G node as the second correction signal G9. Because the first correction signal F10 has the value "1", the second correction circuit 32 including the OR circuit K10 outputs the first correction signal F10 to the G node as the second correction signal G10 without correcting the value of the first correction signal F10 using a first correction signal above the first correction signal F10. By the correction process above, the value of the comparison signal E9 where the error occurred is corrected from "0" to "1", and a thermometer code having only one logical boundary is outputted at the G node.

FIG. 6A was used to describe a case in which an error has occurred in the comparison signal E9 outputted from the comparator C9, but there are also cases in which an error has not occurred in the comparison signal E9 but has occurred in the comparison signal E10 outputted from the comparator C10. The bubble error correction circuit 30 of the present embodiment outputs exactly the same result for both cases. In other words, the bubble error correction circuit 30 of the present embodiment prevents encoded values from diverging too greatly from the true value as a result of bubble errors in the thermometer code, but does not guarantee that the true value will be outputted.

FIG. 6B shows the result of encoding, using the encoding circuit 50, thermometer code for which error correction was performed as described above. As shown in FIG. 6B, the binary code attained by encoding is "01010" in base 2 and "10" in base 10. In the case of FIG. 6A, the true value is thought to be any one of 8, 9, or 10 in base 10. In this manner, the bubble error correction circuit 30 of the present embodiment corrects bubble errors to mitigate divergence from the true value.

FIG. 7A shows the signal values of nodes for a case in which the value of the comparison signals E1 to E7 outputted by the comparators C1 to C7 is "1", the value of the comparison signals E8, E9, and E11 to E31 outputted from the comparators C8, C9, and C11 to C31 is "0", and the value of the comparison signal E10 outputted by the comparator C10 is "1" due to an error. That is, FIG. 7A shows a case in which a bubble error where two or more 0's are present between 1's in the thermometer code (that is, a bubble error with a "bubble" of a plurality of bits) has occurred.

The value of the comparison signal E8 is "0", and thus, the first correction circuit 31 including the OR circuit H8 and the AND circuit J8 does not correct the value of the comparison signal E8 by comparison signals at a lower step than the comparison signal E8. Thus, the value of the first correction signal F8 outputted to the F node is "0". Similarly, the value of the comparison signal E9 is "0", and thus, the first correction circuit 31 including the OR circuit H9 and the AND circuit J9 does not correct the value of the comparison signal E9 by comparison signals at a lower step than the comparison signal E9. Thus, the value of the first correction signal F9 outputted to the F node is "0". The value of the comparison signal E9 one step below the comparison signal E10 and the value of the comparison signal E8 two steps below the comparison signal E10 are both "0", and thus, the first correction circuit 31 including the OR circuit H10 and the AND circuit J10 corrects the value of the comparison signal E10 from "1" to "0".

Because the first correction signals F9, F10, and F11, which are one to three steps above the first correction signal F8, each have a value of "0", the second correction circuit 32 including the OR circuit K8 outputs the first correction signal F8 to the G node as the second correction signal G8 without correcting the value of the first correction signal F8, which is "0". Similarly, because the first correction signals F10, F11, and F12, which are one to three steps above the first correction signal F9, each have a value of "0", the second correction circuit 32 including the OR circuit K9 outputs the first correction signal F9 to the G node as the second correction signal G9 without correcting the value of the first correction signal F9, which is "0". Similarly, because the first correction signals F11, F12, and F13, which are one to three steps above the first correction signal F10, each have a value of "0", the second correction circuit 32 including the OR circuit K10 outputs the first correction signal F10 to the G node as the second correction signal G10 without correcting the value of the first correction signal F10, which is "0". By the correction process above, the value of the comparison signal E10 where the error occurred is corrected from "1" to "0", and a thermometer code having only one logical boundary is outputted at the G node.

FIG. 7A was used to describe a case in which an error has occurred in the comparison signal E10 outputted from the comparator C10, but there are also cases in which an error has not occurred in the comparison signal E10 but has occurred in the comparison signals E8 and E9 outputted from the comparators C8 and C9. The bubble error correction circuit 30 of the present embodiment outputs exactly the same result for both cases. As described above, the bubble error correction circuit 30 of the present embodiment prevents encoded values from diverging too greatly from the true value as a result of bubble errors in the thermometer code, but does not guarantee that the true value will be outputted.

FIG. 7B shows the result of encoding, using the encoding circuit 50, thermometer code for which error correction was performed as described above, and FIG. 7C shows the result of encoding the thermometer code using the encoding circuit 50 without performing error correction. As shown in FIG. 7B, the binary code attained by encoding the thermometer code for which error correction was performed is "00111" in base 2 and "7" in base 10. On the other hand, as shown in FIG. 7C, the binary code attained by encoding the thermometer code for which error correction was not performed is "01111" in base 2 and "15" in base 10. In the case of FIG. 7A, the true value is thought to be any one of 7, 8, 9, or 10 in base 10. If the bubble error is not corrected, the thermometer code greatly diverges from the true value as a result of including a plurality of logical boundaries. The bubble error correction circuit 30 of the present embodiment corrects bubble errors to mitigate divergence from the true value.

FIG. 8A shows the signal values of nodes for a case in which the value of the comparison signals E1 to E6, E9, and E10 outputted by the comparators C1 to C6, C9, and C10 is "1", the value of the comparison signals E11 to E31 outputted from the comparators C11 to C31 is "0", and the value of the comparison signals E7 and E8 outputted by the comparators C7 and C8 is "0" due to an error. That is, FIG. 8A shows a case in which a bubble error where two or more 0's are present between 1's in the thermometer code (that is, a bubble error with a "bubble" of a plurality of bits) has occurred.

The value of the comparison signal E7 is "0", and thus, the first correction circuit 31 including the OR circuit H7 and the AND circuit J7 does not correct the value of the comparison signal E7 by comparison signals at a lower step than the comparison signal E7. Thus, the value of the first correction signal F7 outputted to the F node is "0". Similarly, the value of the comparison signal E8 is "0", and thus, the first correction circuit 31 including the OR circuit H8 and the AND circuit J8 do not correct the value of the comparison signal E8 by comparison signals at a lower step than the comparison signal E8. Thus, the value of the first correction signal F8 outputted to the F node is "0". The value of the comparison signal E8 one step below the comparison signal E9 and the value of the comparison signal E7 two steps below the comparison signal E9 are both "0", and thus, the first correction circuit 31 including the OR circuit H9 and the AND circuit J9 corrects the value of the comparison signal E9 from "1" to "0". Thus, the value of the first correction signal F9 outputted to the F node is "0". The value of the comparison signal E9 one step below the comparison signal E10 is "1", and thus, the first correction circuit 31 including the OR circuit H10 and the AND circuit J10 does not correct the value of the comparison signal E10. Thus, the value of the first correction signal F10 outputted to the F node is "1".

Because the first correction signal F10, which is three steps above the first correction signal F7, has a value of "1", the second correction circuit 32 including the OR circuit K7 corrects the value of the first correction signal F7 from "0" to "1", and outputs this to the G node as the second correction signal G7. Because the first correction signal F10, which is two steps above the first correction signal F8, has a value of "1", the second correction circuit 32 including the OR circuit K8 corrects the value of the first correction signal F8 from "0" to "1", and outputs this to the G node as the second correction signal G8. Because the first correction signal F10, which is one step above the first correction signal F9, has a value of "1", the second correction circuit 32 including the OR circuit K9 corrects the value of the first correction signal F9 from "0" to "1", and outputs this to the G node as the second correction signal G9. Because the first correction signal F10 has the value "1", the second correction circuit 32 including the OR circuit K10 outputs the first correction signal F10 to the G node as the second correction signal G10 without correcting the value of the first correction signal F10 using a first correction signal above the first correction signal F10. By the correction process above, the value of the comparison signals E7 and E8 where the error occurred is corrected from "0" to "1", and a thermometer code having only one logical boundary is outputted at the G node.

FIG. 8A was used to describe a case in which an error has occurred in the comparison signals E7 and E8 outputted from the comparators C7 and C8, but there are also cases in which an error has not occurred in the comparison signals E7 and E8 but has occurred in the comparison signals E9 and E10 outputted from the comparators C9 and C10. The bubble error correction circuit 30 of the present embodiment outputs exactly the same result for both cases. As described above, the bubble error correction circuit 30 of the present embodiment prevents encoded values from diverging too greatly from the true value as a result of bubble errors in the thermometer code, but does not guarantee that the true value will be outputted.

FIG. 8B shows the result of encoding, using the encoding circuit 50, thermometer code for which error correction was performed as described above, and FIG. 8C shows the result of encoding the thermometer code using the encoding circuit 50 without performing error correction. As shown in FIG. 8B, the binary code attained by encoding the thermometer code for which error correction was performed is "01010" in base 2 and "10" in base 10. On the other hand, as shown in FIG. 8C, the binary code attained by encoding the thermometer code for which error correction was not performed is "01110" in base 2 and "14" in base 10. In the case of FIG. 8A, the true value is thought to be any one of 6, 7, 8, 9, or 10 in base 10. If the bubble error is not corrected, the thermometer code greatly diverges from the true value as a result of including a plurality of logical boundaries. The bubble error correction circuit 30 of the present embodiment corrects bubble errors to mitigate divergence from the true value.

FIG. 9 shows an example of a relationship between a plurality of reference voltages outputted from the reference voltage generation circuit 10, and the input analog voltage $V_{AIN}$. As described above, the resistance r/3 of the resistors R16 and R17 of the reference voltage generation circuit 10 is less than the resistance r of the other resistors R2 to R5 and R18 to R31, and thus, the difference between the reference voltages V15 and V16 and the difference between the reference voltages V16 and V17 are less than the difference between other adjacent reference voltages. As a result, the A/D conversion resolution for the input analog voltage $V_{AIN}$ is greater in the range of the reference voltages V15 to V17 than in other ranges. By performing A/D conversion at a high resolution in a portion of the voltage range of the input analog voltage $V_{AIN}$ in this manner, desired functionality can be exhibited in an electronic device including this A/D converter circuit. By performing A/D conversion at a high resolution in a portion of the voltage range in an A/D converter circuit used in such an application, it is possible to reduce the number of comparators compared to a case in which A/D conversion is performed at high resolution over the entire voltage range.

Figure 10:
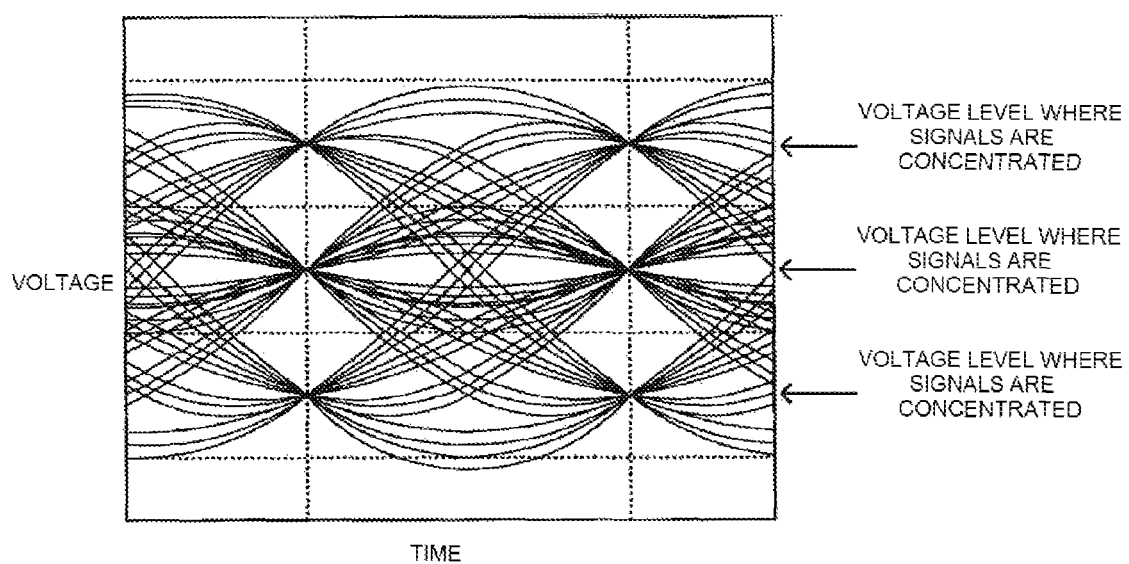
FIG. 10 shows an example of an eye pattern of an input analog voltage.

Also, as shown by the eye pattern in FIG. 10, the resistance of the resistors constituting the reference voltage generation circuit 10 may be set for an analog signal where the signal is concentrated in a specific plurality of voltage ranges such that the voltage difference is relatively small between adjacent reference voltages in respective ranges corresponding to the voltage ranges where the signal is concentrated. In this manner, it is possible to increase the A/D conversion resolution in a localized manner in the respective voltage ranges where the signal is concentrated.

Also, in the present embodiment, the comparator C16 where the reference voltage V16, belonging to a voltage range where A/D conversion should be performed at a high resolution, is inputted has a higher sensitivity than other comparators. In this manner, it is possible to increase the A/D conversion accuracy in voltage ranges where A/D conversion should be performed at high resolution. If there are a plurality of voltage ranges where A/D conversion should be performed at high resolution, then it is preferable that at least one high sensitivity comparator be disposed for each of the plurality of voltage ranges.

In the bubble error correction circuit 30 of the present embodiment, the value of the comparison signal E16 outputted from the high sensitivity comparator C16 is considered to have a relatively high reliability, and thus, the comparison signal E16 is given a higher priority in the bubble error correction process. Below, an aspect of increasing the priority of the comparison signal E16 in a bubble error correction process will be described using a specific example.

FIG. 11A shows the signal values of nodes for a case in which the value of the comparison signals E1 to E15 outputted by the comparators C1 to C15 is "1", the value of the comparison signals E18 to E31 outputted from the comparators C18 to C31 is "0", and the value of the comparison signal E17 outputted by the comparator C17 is "1" due to an error.

As shown in FIG. 4, comparison signals E16 are inputted to the two input terminals of the OR circuit H17. The comparison signal E16 has a value of "0", and thus, the output signal of the OR circuit H17 takes on a value of "0". Thus, the first correction circuit 31 including the OR circuit H17 and the AND circuit J17 outputs the first correction signal F17 where the value of the comparison signal E17 has been corrected from "1" to "0". Because the first correction signals F18, F19, and F20, which are one to three steps above the first correction signal F 17, each have a value of "0", the second correction circuit 32 including the OR circuit K17 outputs the first correction signal F17 to the G node as the second correction signal G17 without correcting the value of the first correction signal F17, which is "0". In this manner, the value of the comparison signal E17 where the error occurred is corrected from "1" to "0" according to the value of the comparison signal E16, and a thermometer code having only one logical boundary is outputted at the G node. Thus, in the bubble error correction circuit 30 of the present embodiment, errors occurring in the comparison signal E17 are corrected by the comparison signal E16, which is at a lower step than the comparison signal E17. If no priority is set for specific comparison signals, then as shown in FIG. 6A, the lower step comparison signal value "0" is corrected to "1" by the upper step comparison signal value "1", which is opposite to the case of FIG. 11A.

FIG. 11B shows the result of encoding, using the encoding circuit 50, thermometer code for which error correction was performed as described above, and FIG. 11C shows the result of encoding the thermometer code using the encoding circuit 50 without performing error correction. As shown in FIG. 11B, the binary code attained by encoding the thermometer code for which error correction was performed is "01111" in base 2 and "15" in base 10. On the other hand, as shown in FIG. 11C, the binary code attained by encoding the thermometer code for which error correction was not performed is "11111" in base 2 and "31" in base 10. In the case of FIG. 11A, the true value is thought to be any one of 15, 16, or 17 in base 10. If the bubble error is not corrected, the thermometer code greatly diverges from the true value as a result of including a plurality of logical boundaries. The bubble error correction circuit 30 of the present embodiment corrects bubble errors to mitigate divergence from the true value.

FIG. 12A shows the signal values of nodes for a case in which the value of the comparison signals E1 to E14 and E16 outputted by the comparators C1 to C14 and C16 is "1", the value of the comparison signals E17 to E31 outputted from the comparators C17 to C31 is "0", and the value of the comparison signal E15 outputted by the comparator C15 is "0" due to an error.

The value of the comparison signal E15 outputted by the comparator C15 is "0", and thus, the first correction circuit 31 including the OR circuit H15 and the AND circuit J15 does not correct the value of the comparison signal E15 by comparison signals at a lower step than the comparison signal E15. Thus, the value of the first correction signal F15 outputted to the F node is "0". Meanwhile, the value of the comparison signal E16 outputted by the comparator C16 is not corrected, and the value of the first correction signal F16 outputted to the F node is "1". Because the first correction signal F16, which is one step above the first correction signal F15, has a value of "1", the second correction circuit 32 including the OR circuit K15 corrects the value of the first correction signal F15 from "0" to "1", and outputs this to the G node as the second correction signal G15. In this manner, the value of the comparison signal E15 where the error occurred is corrected from "0" to "1", and a thermometer code having only one logical boundary is outputted at the G node.

In the case of FIG. 12A, similar to the case shown in FIG. 6A, the lower step comparison signal E15 value "0" is corrected to "1" by the higher step comparison signal E16 value "1". In other words, the bubble error correction circuit 30 of the present embodiment essentially has a structure in which the upper step comparison signals are prioritized. However, the comparison signal E16 outputted by the high sensitivity comparator C16 is exceptionally prioritized over the comparison signal E17, which is at a higher step. As a result, it is possible to increase the degree to which the relatively high reliability comparison signal E16 contributes to error correction, allowing for higher accuracy correction.

FIG. 12B shows the result of encoding, using the encoding circuit 50, thermometer code for which error correction was performed as described above, and FIG. 12C shows the result of encoding the thermometer code using the encoding circuit 50 without performing error correction. As shown in FIG. 12B, the binary code attained by encoding the thermometer code for which error correction was performed is "10000" in base 2 and "16" in base 10. On the other hand, as shown in FIG. 12C, the binary code attained by encoding the thermometer code for which error correction was not performed is "11110" in base 2 and "30" in base 10. In the case of FIG. 12A, the true value is thought to be any one of 14, 15, or 16 in base 10. If the bubble error is not corrected, the thermometer code greatly diverges from the true value as a result of including a plurality of logical boundaries. The bubble error correction circuit 30 of the present embodiment corrects bubble errors to mitigate divergence from the true value.

Figure 13:
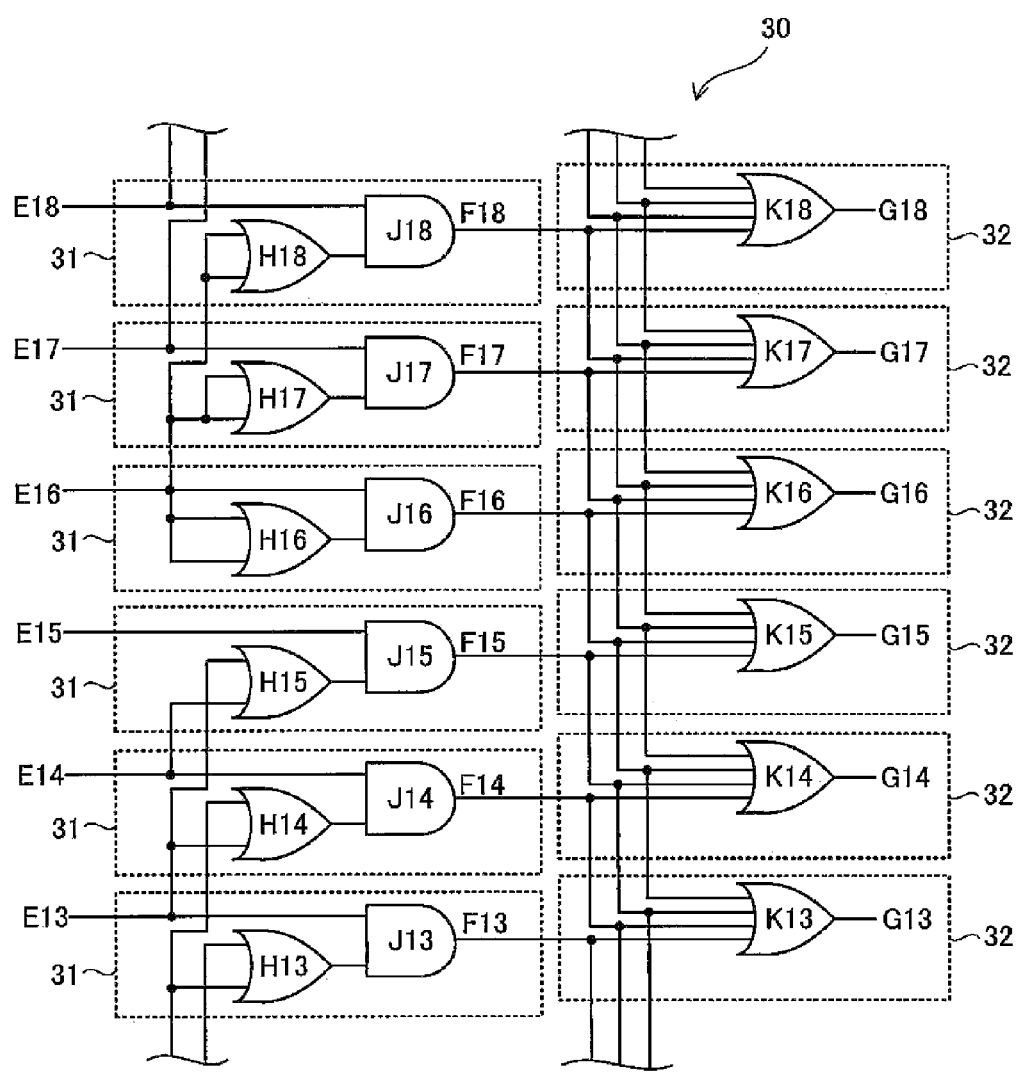
FIG. 13 is an equivalent circuit diagram of a bubble error correction circuit according to an embodiment of the present invention.

FIG. 13 shows an example of a configuration for a case of error correction in the bubble error correction circuit 30 in which the degree to which the relatively high reliability comparison signal E16, outputted from the high sensitivity comparator C16, contributes to error correction is even further increased. In the example shown in FIG. 13, the two input terminals of the OR circuit H16 are both connected to the output terminal of the high sensitivity comparator C16, and the comparison signal E16 is inputted to these two input terminals. In this manner, the comparison signal E16 is no longer corrected by other adjacent comparison signals at a lower step. Also, the two input terminals of the OR circuit H18 are both connected to the output terminal of the high sensitivity comparator C16, and the comparison signal E16 is inputted to these two input terminals. In this manner, the comparison signal E16 is prioritized over the comparison signal E18, which is two steps above the comparison signal E16. If the comparison signal E16 is prioritized over a comparison signal that is even further thereabove, then the comparison signal E16 should be inputted to the two input terminals of the OR circuit constituting the first correction circuit 31 that corrects the upper step comparison signal.

A case was illustrated in which, in the bubble error correction circuit 30 of the present embodiment, the comparison signals one step and two steps below the comparison signal to be corrected are used to correct the comparison signal to be corrected in the first correction circuit 31, and in the second correction circuit 32, the first correction signals one to three steps above the first correction signal to be corrected are used to correct the first correction signal to be corrected, but the configuration is not limited to to this aspect. In the first correction circuit 31, three or more comparison signals adjacent to and below the comparison signal to be corrected may be used to correct the comparison signal to be corrected. In such a case, the OR circuits H1 to H31 of the first correction circuit 31 would have three or more input terminals, and the three or more comparison signals adjacent to and below the comparison signal to be corrected would be inputted to the respective input terminals. Also, in the second correction circuit 32, two or four or more first correction signals above and adjacent to the first correction signal to be corrected may be used to correct the first correction signal to be corrected. In such a case, the OR circuits K1 to K31 of the second correction circuit 32 would have two or four or more input terminals, and the two or four or more first correction signals adjacent to and above the first correction signal to be corrected would be inputted to the respective input terminals. In the bubble error correction circuit 30 of the present embodiment, by increasing the number of signals, used for correction, adjacent to and above and below the signal to be corrected, it is possible to perform correction on bubble errors where three or more 0's (bubbles) are present between 1's in the thermometer code. In this manner, according to the semiconductor device 1 constituting the A/D converter circuit according to an embodiment of the present invention, the range of bubble error correction can be expanded with ease.

Figure 14:
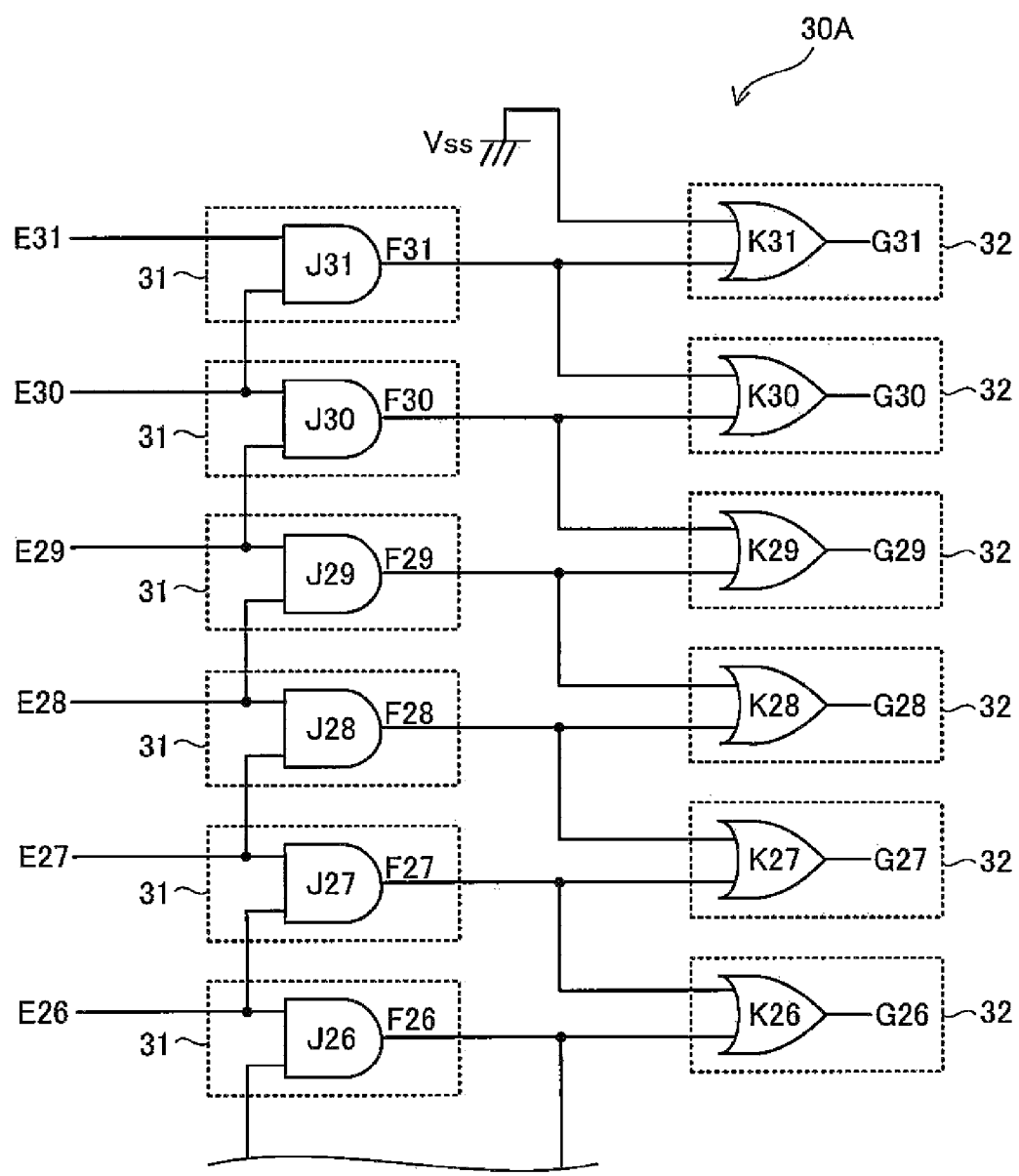
FIG. 14 is an equivalent circuit diagram of a bubble error correction circuit according to an embodiment of the present invention.

FIG. 14 shows a configuration of a bubble error correction circuit 30A according to a modification example. In FIG. 14, only portions of the bubble error correction circuit 30A where the comparison signals E26 to E31 are inputted are shown; other portions have similar configurations to portions already shown, and thus, those portions are omitted from depiction.

The bubble error correction circuit 30A differs from the bubble error correction circuit 30 in that the first correction circuit 31 does not include OR circuits, and in that there are two input terminals for each OR circuit constituting the second correction circuit 32.

One input terminal of each of the AND circuits J26 to J31 is connected to the output terminal of each of the corresponding comparators C26 to C31, and receives as input the corresponding comparison signal E26 to E31. The other input terminal of each of the AND circuits J26 to J31 is connected to the output terminal of each of the comparators disposed one step lower than the corresponding comparators C26 to C31, and receives as input the comparison signal outputted from the comparator disposed below. The comparison signal E28 outputted from the corresponding comparator C28 is inputted to the one input terminal of the AND circuit J28. The other input terminal of the AND circuit J28 receives as input the comparison signal E27 outputted from the comparator C27 disposed one step lower than the corresponding comparator C28, for example.

One input terminal of each of the OR circuits K26 to K31 is connected to the output terminal of each of the corresponding AND circuits J26 to J31, and receives as input the first correction signals F26 to F31 outputted from the corresponding AND circuit. The other input terminals of each of the OR circuits K26 to K30 are connected to the output terminal of each of the AND circuits disposed one step above the corresponding AND circuits J26 to J30, and receive as input the first correction signals outputted from the higher step AND circuits. The first correction signal F28 outputted from the corresponding AND circuit J28 is inputted to the one input terminal of the OR circuit K28. The other input terminal of the OR circuit K28 receives as input the first correction signal F29 outputted from the AND circuit J29 disposed one step above the corresponding AND circuit J28, for example. A ground voltage Vss (logical value of "0") is inputted to the other input terminal of the OR circuit K31.

In the bubble error correction circuit 30A, the comparison signals one step below the comparison signal to be corrected is used to correct the comparison signal to be corrected in the first correction circuit 31, and in the second correction circuit 32, the first correction signal one step above the first correction signal to be corrected is used to correct the first correction signal to be corrected.

According to the bubble error correction circuit 30A, it is possible to perform correction on bubble errors that are most likely to occur (bubble errors in which one "0" is present between "1's"). Additionally, it is possible to reduce the scale of the circuit even more than in the bubble error correction circuit 30.

Figure 15:
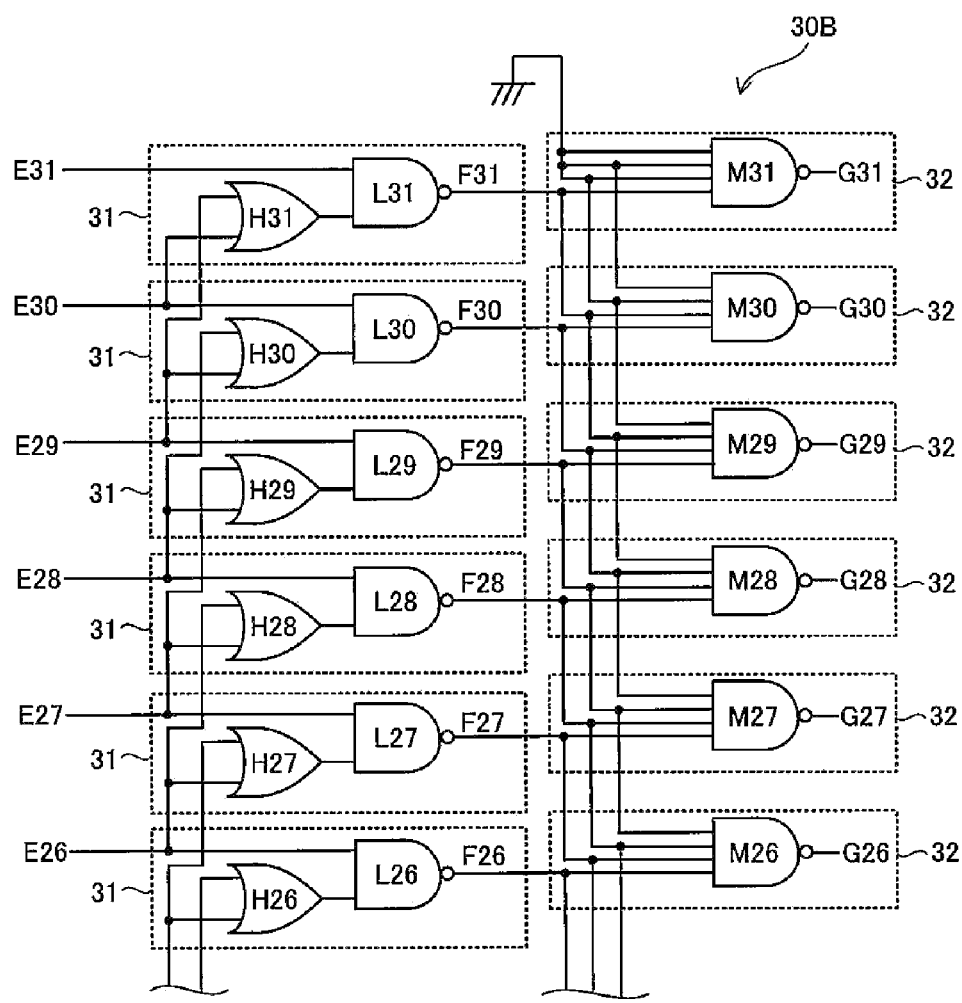
FIG. 15 is an equivalent circuit diagram of a bubble error correction circuit according to an embodiment of the present invention.
Figure 16:
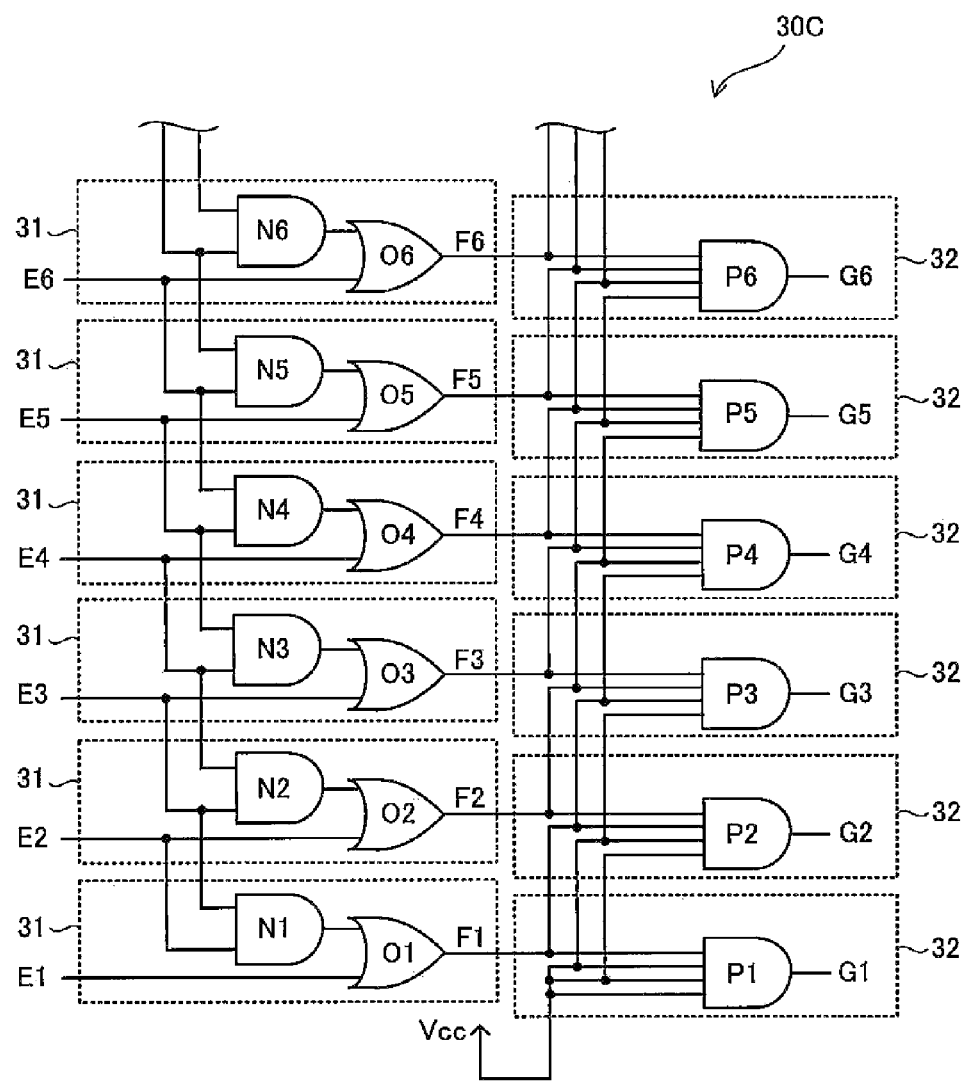
FIG. 16 is an equivalent circuit diagram of a bubble error correction circuit according to an embodiment of the present invention.
Figure 17:
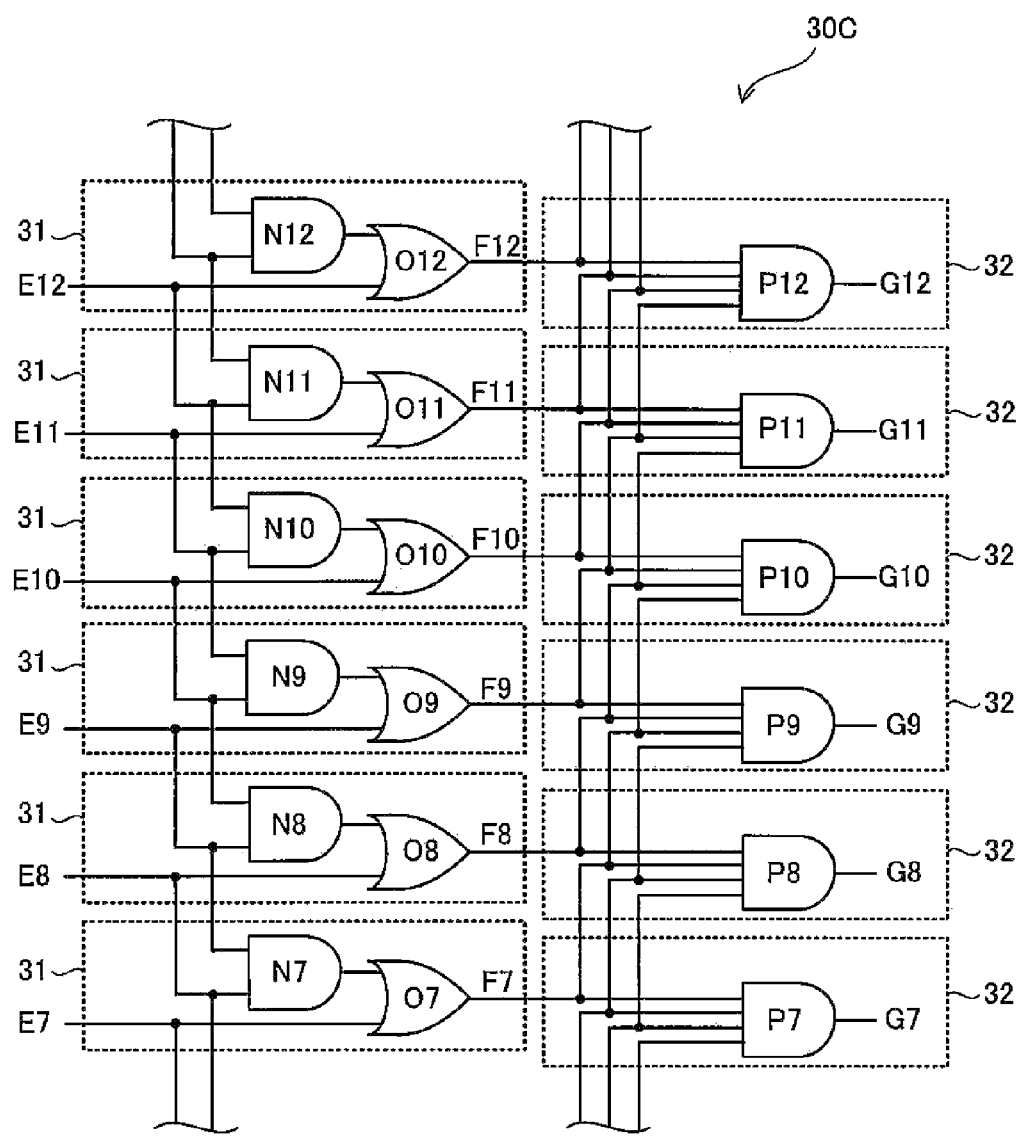
FIG. 17 is an equivalent circuit diagram of a bubble error correction circuit according to an embodiment of the present invention.

FIG. 15 shows a configuration of a bubble error correction circuit 30B according to a modification example. In FIG. 15, only portions of the bubble error correction circuit 30B where the comparison signals E26 to E31 are inputted are shown; other portions have similar configurations to portions already shown, and thus, those portions will not be mentioned.

In the bubble error correction circuit 30B, the AND circuits J26 to J31 in the bubble error correction circuit 30 are replaced by NAND (negative AND) circuits L26 to L31, and the OR circuits K26 to K31 in the bubble error correction circuit 30 are replaced by NAND circuits M26 to M31 (negative logical conjunction or NAND operation). According to the bubble error correction circuit 30B, it is possible to attain similar error correction results to the bubble error correction circuit 30. The combination circuit constituted of an OR circuit and NAND circuit of the first correction circuit 31 may be replaced by an OR-NAND-type oai21 complex gate.

<Embodiment 2>

FIGS. 16 to 19 are equivalent circuit diagrams of a bubble error correction circuit 30C according to Embodiment 2 of the present invention. The bubble error correction circuit 30C includes 2-input AND circuits N1 to N31, 2-input OR circuits O1 to O31, and 4-input AND circuits P1 to P31, which are provided so as to correspond with the comparators C1 to C31 constituting the comparison circuit 20.

One input terminal of each of the OR circuits O1 to O31 is connected to the output terminal of each of the corresponding comparators C1 to C31, and receives as input the corresponding comparison signal E1 to E31. The other input terminal of each of the OR circuits O1 to O31 is connected to the output terminal of each of the corresponding AND circuits N1 to N31, and receives as input the output signal of the corresponding AND circuit. A comparison signal E3 outputted from the corresponding comparator C3 is inputted to one input terminal of the OR circuit O3, and an output signal from the corresponding AND circuit N3 is inputted to the other input terminal of the OR circuit O3, for example.

One input terminal of each of the AND circuits N1 to N29 is connected to the output terminal of each of the comparators disposed one step above the corresponding comparators C1 to C29, and receives as input the comparison signal outputted from the comparator disposed one step above. The other input terminal of each of the AND circuits N1 to N29 is connected to the output terminal of each of the comparators disposed two steps above the corresponding comparators C1 to C29, and receives as input the comparison signal outputted from the comparator disposed two steps above. The comparison signal E4 outputted from the corresponding comparator C4 is inputted to the one input terminal of the AND circuit N3, the comparator C4 being disposed one step above the corresponding comparator C3. The other input terminal of the AND circuit N3 receives as input the comparison signal E5 outputted from the comparator C5 disposed two steps above the corresponding comparator C3, for example. "Comparator disposed at a higher step" refers to a comparator receiving as input a higher reference voltage.

The comparison signal E31 outputted from the comparator C31 is inputted to the one input terminal of the AND circuit N30, the comparator C31 being disposed one step above the corresponding comparator C30. The other input terminal receives as input the ground voltage Vss (logic level of "0"). In the AND circuit N31, the ground voltage Vss (logic level of "0") is inputted to both input terminals.

Figure 18:
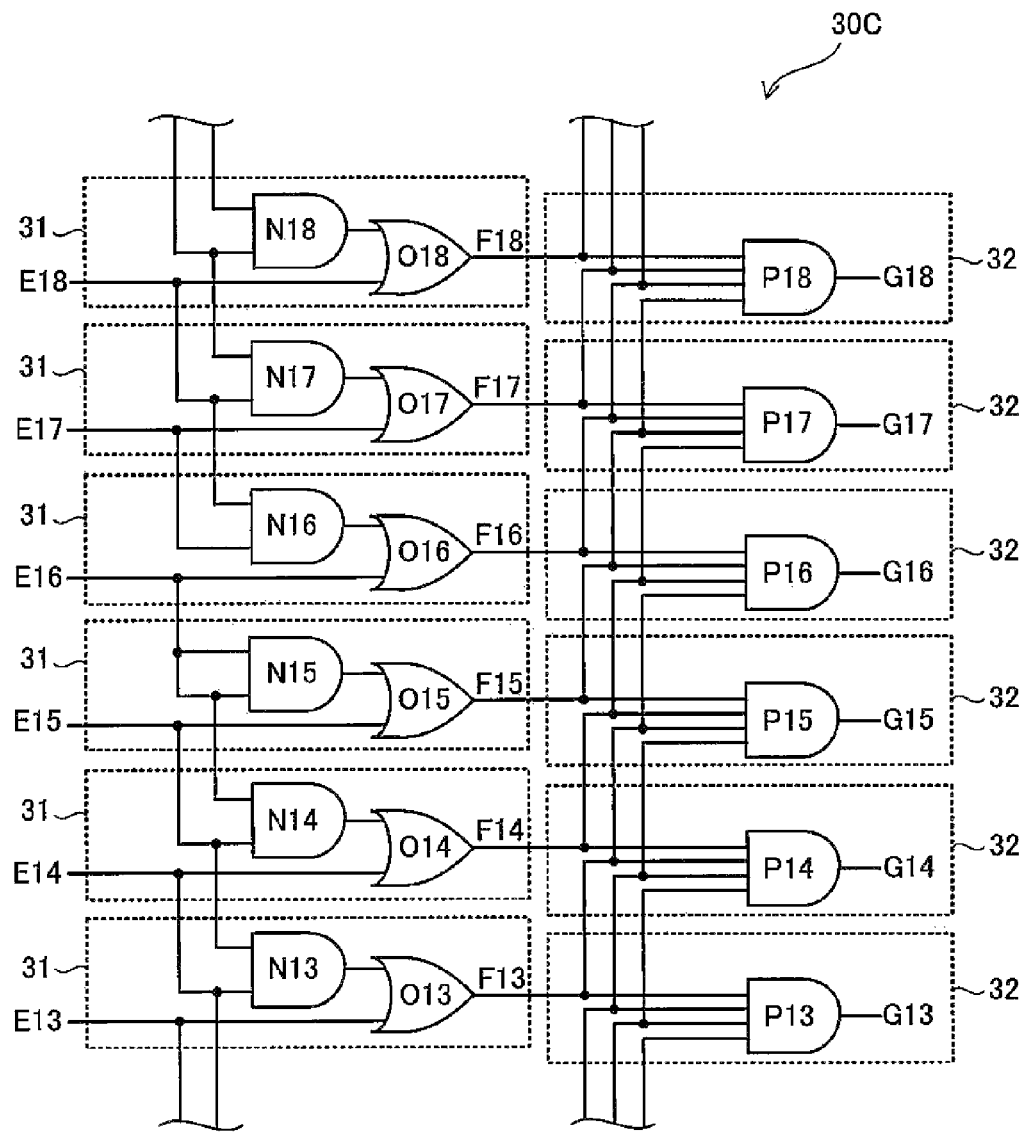
FIG. 18 is an equivalent circuit diagram of a bubble error correction circuit according to an embodiment of the present invention.
Figure 19:
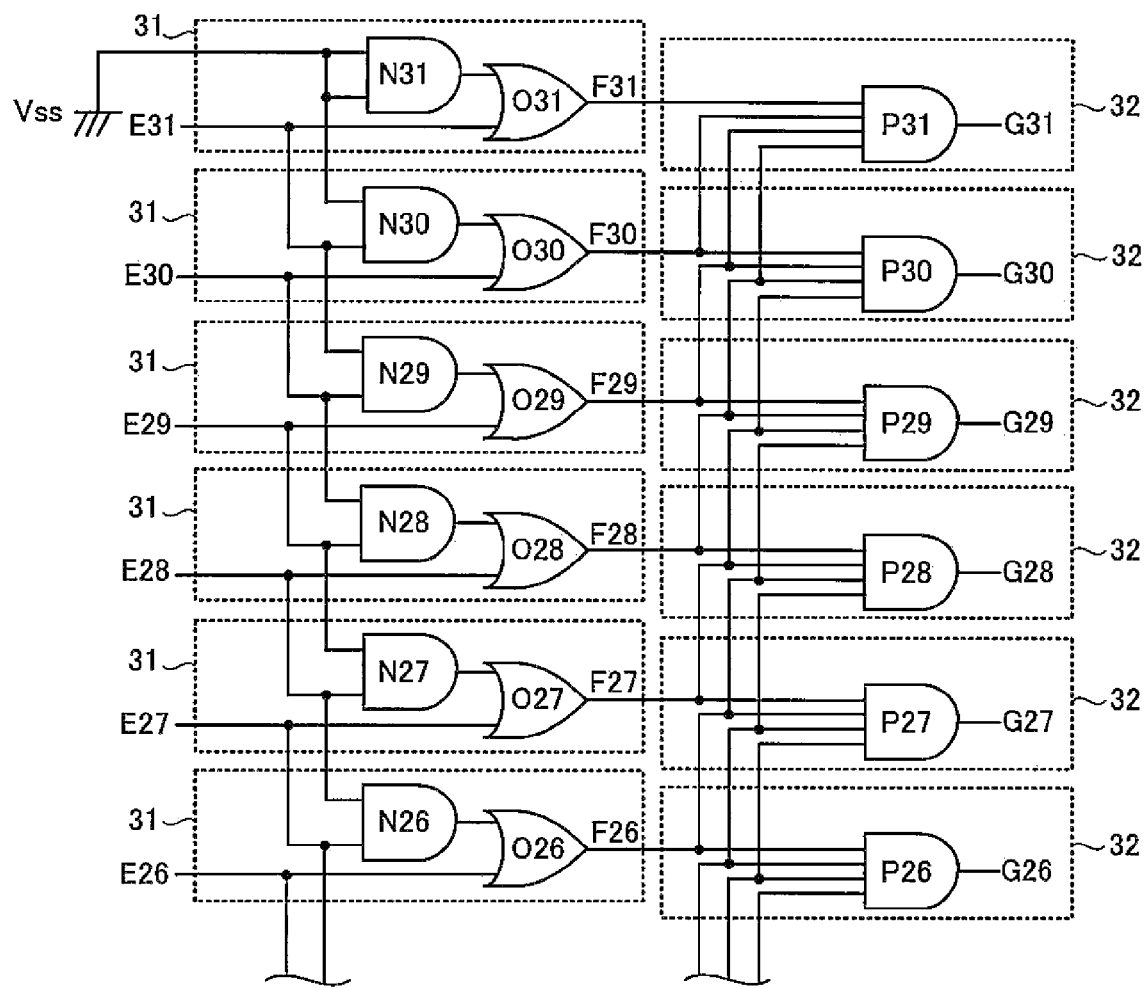
FIG. 19 is an equivalent circuit diagram of a bubble error correction circuit according to an embodiment of the present invention.

As shown in FIG. 18, in the bubble error correction circuit 30 of the present embodiment, both of the input terminals of the AND circuit N15 are connected to the output terminal of the comparator C16 disposed one step above, which is an exceptional connective configuration. A configuration may be adopted in which the AND circuit N15 is omitted, with the comparison signal E15 being inputted to one input terminal of the OR circuit O15 and the comparison signal E16 being directly inputted to the other input terminal of the OR circuit O15.

The one input terminal of each of the AND circuits P4 to P31 is connected to the output terminal of each of the corresponding OR circuits O4 to O31, and receives as input the output signal F4 to F31 outputted from the corresponding OR circuit. The other three input terminals of each of the AND circuits P4 to P31 are connected to the output terminal of each of the OR circuits disposed one to three steps below the corresponding OR circuits O4 to O31, and receive as input the output signals outputted from the three OR circuits disposed in lower steps. One input terminal of the AND circuit P4 receives as input the output signal F4 outputted from the corresponding OR circuit O4, and the other three input terminals receive as input the output signals F3, F2, and F1 outputted respectively from the OR circuits O3, O2, and O1 disposed one to three steps below the corresponding OR circuit O4, for example.

One input terminal of the AND circuit P3 receives as input the output signal F3 outputted from the corresponding OR circuit O3, other two input terminals receive as input the output signals F2 and F1 outputted respectively from the OR circuits O2 and O1 disposed below the corresponding OR circuit O3, and the remaining one input terminal receives as input the power source voltage Vcc (logic level "1").

One input terminal of the AND circuit P2 receives as input the output signal F2 outputted from the corresponding OR circuit O2, another one input terminal receives as input the output signal F1 outputted from the OR circuit O1 disposed below the corresponding OR circuit O2, and the remaining two input terminals receive as input the power source voltage Vcc (logic level "1").

One input terminal of the AND circuit P1 receives as input the output signal F1 outputted from the corresponding OR circuit O1, and the remaining three input terminals receive as input the power source voltage Vcc (logic level "1").

"OR circuit disposed at a lower step" refers to an OR circuit that receives as input a comparison signal from a comparator receiving as input a lower reference voltage.

Below, the functions and operations of the bubble error correction circuit 30C will be described. Errors occurring in the comparison signals E1 to E31 outputted by the comparators C1 to C31 are, respectively, corrected by a first correction circuit 31 including corresponding AND circuits N1 to N31 and corresponding OR circuits O1 to O31, and the result of correction is outputted as output signals F1 to F31 of the OR circuits O1 to O31. Below, the output signals F1 to F31 of the OR circuits O1 to O31 are referred to as first correction signals F1 to F31.

The first correction signals F1 to F31 are, respectively, further corrected by a second correction circuit 32 including corresponding latter stage AND circuits P1 to P31, and the result of correction is outputted as output signals G1 to G31 of the AND circuits P1 to P31. Below, the output signals G1 to G31 of the AND circuits P1 to P31 are referred to as second correction signals G1 to G31. The second correction signals G1 to G31 are supplied to the logical boundary detection circuit 40 as a corrected thermometer code. Errors occurring in the comparison signal E3 outputted by the comparator C3 are corrected by the first correction circuit 31 including the corresponding AND circuit N3 and the corresponding OR circuit O3, and the first correction signal F3 is generated. The first correction signal F3 is further corrected by the second correction circuit 32 including the AND circuit P3, and the second correction signal G3 is generated.

The first correction circuit 31 of the present embodiment corrects errors occurring in the comparison signals E1 to E31 using the comparison signal one step above the corresponding comparison signal and the comparison signal two steps above the corresponding comparison signal. More specifically, if the comparison signal to be corrected has a value of "0", and the comparison signals one and two steps above the comparison signal to be corrected both have a value of "1", then the first correction circuit 31 corrects the comparison signal to be corrected to "1". The first correction circuit 31 otherwise does not correct the value of the comparison signal to be corrected. If the comparison signal E3 to be corrected has a value of "0", and the comparison signals E4 and E5, which are respectively one and two steps above the comparison signal to be corrected, both have a value of "1", then the first correction circuit 31, which performs error correction on the comparison signal E3, corrects the value of the comparison signal E3 to be corrected to "1", for example. "Comparison signal at a higher step" refers to a comparison signal outputted by a comparator receiving as input a higher reference voltage.

In the present embodiment, correction of the comparison signal E15 is performed in an exceptional manner. As shown in FIG. 18, the two input terminals of the AND circuit N15 constituting the first correction circuit 31, which performs error correction on the comparison signal E15, are both connected to the output terminal of the comparator C16, which is one step higher. According to this configuration, if the comparison signal E15 has a value of "0" but the comparison signal E16 has a value of "1", then the value of the comparison signal E15 is corrected to "1". That is, the value of the comparison signal E16 is prioritized over the comparison signal E15. As described in the present embodiment, the comparator C16 is a high sensitivity comparator with a higher sensitivity than other comparators, which means that the probability of an error occurring is relatively low and the reliability of the value of the comparison signal E16 is relatively high. Thus, by prioritizing the value of the comparison signal E16 over the comparison signal E15, it is possible to increase the degree to which the relatively high reliability comparison signal E16 contributes to error correction, allowing for higher accuracy correction.

The second correction circuit 32 of the present embodiment corrects the first correction signal to be corrected using the first correction signals one to three steps below the corresponding first correction signal. More specifically, if the first correction signal to be corrected has a value of "1", and at least one of the first correction signals one to three steps below the first correction signal to be corrected has a value of "0", then the second correction circuit 32 corrects the value of the first correction signal to be corrected to "0". If the first correction signal F4 to be corrected has a value of "1", and at least one of the first correction signals F1 to F3 one to three steps below the first correction signal F4 to be corrected has a value of "0", then the second correction circuit 32, which performs error correction on the first correction signal F4, corrects the value of the first correction signal F4 to be corrected to "0", for example. "First correction signal at a lower step" refers to a first correction signal for a comparison signal outputted by a comparator receiving as input a lower reference voltage.

Below, the functions and operations of the bubble error correction circuit 30C of the present embodiment will be described with reference to specific cases shown in FIGS. 20 to 22.

Similar to the case of FIG. 6A, FIG. 20A shows the signal values of nodes for a case in which the value of the comparison signals E1 to E8 and E10 outputted by the comparators C1 to C8 and C10 is "1", the value of the comparison signals E11 to E31 outputted from the comparators C11 to C31 is "0", and the value of the comparison signal E9 outputted by the comparator C9 is "0" due to an error. The E nodes in FIG. 20A are output terminal nodes of the comparators C1 to C31, the F nodes are output terminal nodes (output nodes of the first correction circuit 31) of the OR circuits O1 to O31, and the G nodes are output terminal nodes (output nodes of the second correction circuit 32) of the AND circuits P1 to P31 (this similarly applies to FIGS. 21A and 22A).

The value of the comparison signal E11 two steps above the comparison signal E9 is "0", and thus, the first correction circuit 31 including the AND circuit N9 and the OR circuit O9 does not correct the value of the comparison signal E9. Thus, the value of the first correction signal F9 outputted to the F node is "0". The value of the comparison signal E10 is "1", and thus, the first correction circuit 31 including the AND circuit N10 and the OR circuit O10 does not correct the value of the comparison signal E10 by comparison signals at a higher step than the comparison signal E10. Thus, the value of the first correction signal F10 outputted to the F node is "1".

Because the first correction signal F9 has the value "0", the second correction circuit 32 including the AND circuit P9 outputs the first correction signal F9 to the G node as the second correction signal G9 without correcting the value of the first correction signal F9 from "0". Because the first correction signal F9, which is one step below the first correction signal F10, has a value of "0", the second correction circuit 32 including the AND circuit P10 corrects the value of the first correction signal F10 from "1" to "0", and outputs this to the G node as the second correction signal G10. By the correction process above, a thermometer code having only one logical boundary is outputted at the G node.

FIG. 20B shows the result of encoding, using the encoding circuit 50, thermometer code for which error correction was performed as described above. As shown in FIG. 20B, the binary code attained by encoding is "01000" in base 2 and "10" in base 8. In the case of FIG. 20A, the true value is thought to be any one of 8, 9, or 10 in base 10. In this manner, the bubble error correction circuit 30C of the present embodiment corrects bubble errors to mitigate divergence from the true value.

Similar to FIG. 7A, FIG. 21A shows the signal values of nodes for a case in which the value of the comparison signals E1 to E7 outputted by the comparators C1 to C7 is "1", the value of the comparison signals E8, E9, and E11 to E31 outputted from the comparators C8, C9, and C11 to C31 is "0", and the value of the comparison signal E10 outputted by the comparator C10 is "1" due to an error. That is, FIG. 21A shows a case in which a bubble error where two or more 0's are present between 1's in the thermometer code (that is, a bubble error with a "bubble" of a plurality of bits) has occurred.

The value of the comparison signal E9 one step above the comparison signal E8 is "0", and thus, the first correction circuit 31 including the AND circuit N8 and the OR circuit O8 does not correct the value of the comparison signal E8. Thus, the value of the first correction signal F8 outputted to the F node is "0". The value of the comparison signal E11 two steps above the comparison signal E9 is "0", and thus, the first correction circuit 31 including the AND circuit N9 and the OR circuit O9 does not correct the value of the comparison signal E9. Thus, the value of the first correction signal F9 outputted to the F node is "0". The value of the comparison signal E10 is "1", and thus, the first correction circuit 31 including the AND circuit N10 and the OR circuit O10 does not correct the value of the comparison signal E10. Thus, the value of the first correction signal F10 outputted to the F node is "1". Because the first correction signal F8 has the value "0", the second correction circuit 32 including the AND circuit P8 outputs the first correction signal F8 to the G node as the second correction signal G8 without correcting the value of the first correction signal F8 from "0". Similarly, because the first correction signal F9 has the value "0", the second correction circuit 32 including the AND circuit P9 outputs the first correction signal F9 to the G node as the second correction signal G9 without correcting the value of the first correction signal F9 from "0". Because the first correction signal F9 and the first correction signal F8, which are respectively one and two steps below the first correction signal F10, have a value of "0", the second correction circuit 32 including the AND circuit P10 corrects the value of the first correction signal F10 from "1" to "0", and outputs this to the G node as the second correction signal G10. By the correction process above, a thermometer code having only one logical boundary is outputted at the G node.

FIG. 21B shows the result of encoding, using the encoding circuit 50, thermometer code for which error correction was performed as described above. As shown in FIG. 21B, the binary code attained by encoding the thermometer code for which error correction was performed is "00111" in base 2 and "7" in base 10. In the case of FIG. 21A, the true value is thought to be any one of 7, 8, 9, or 10 in base 10. The bubble error correction circuit 30C of the present embodiment corrects bubble errors to mitigate divergence from the true value.

Similar to the case of FIG. 8A, FIG. 22A shows the signal values of nodes for a case in which the value of the comparison signals E1 to E6, E9, and E10 outputted by the comparators C1 to C6, C9, and C10 is "1", the value of the comparison signals E11 to E31 outputted from the comparators C1 to C31 is "0", and the value of the comparison signals E7 and E8 outputted by the comparators C7 and C8 is "0" due to an error. That is, FIG. 22A shows a case in which a bubble error where two or more 0's are present between 1's in the thermometer code (that is, a bubble error with a "bubble" of a plurality of bits) has occurred.

The value of the comparison signal E8 one step above the comparison signal E7 is "0", and thus, the first correction circuit 31 including the AND circuit N7 and the OR circuit O7 does not correct the value of the comparison signal E7. Thus, the value of the first correction signal F7 outputted to the F node is "0". The values of the comparison signals E9 and E10, which are respectively one and two steps above the comparison signal E8, are both "1", and thus, the first correction circuit 31 including the AND circuit N8 and the OR circuit O8 corrects the value of the comparison signal E8 from "0" to "1". Thus, the value of the first correction signal F8 outputted to the F node is "1". The values of the comparison signals E9 and E10 are both "1", and thus, these signals are not corrected in the first correction circuit 31. Thus, the values of the first correction signals F9 and F10 outputted to the F node are "1".

Because the first correction signal F7 has the value "0", the second correction circuit 32 including the AND circuit P7 outputs the first correction signal F7 to the G node as the second correction signal G7 without correcting the value of the first correction signal F7 from "0". Because the first correction signal F7, which is one step below the first correction signal F8, has a value of "0", the second correction circuit 32 including the AND circuit P8 corrects the value of the first correction signal F8 from "1" to "0", and outputs this to the G node as the second correction signal G8. Because the first correction signal F7, which is two steps below the first correction signal F9, has a value of "0", the second correction circuit 32 including the AND circuit P9 corrects the value of the first correction signal F9 from "1" to "0", and outputs this to the G node as the second correction signal G9. Because the first correction signal F7, which is three steps below the first correction signal F10, has a value of "0", the second correction circuit 32 including the AND circuit P10 corrects the value of the first correction signal F10 from "1" to "0", and outputs this to the G node as the second correction signal G10. By the error correction above, a thermometer code having only one logical boundary is outputted at the G node.

FIG. 22B shows the result of encoding, using the encoding circuit 50, thermometer code for which error correction was performed as described above. As shown in FIG. 22B, the binary code attained by encoding is "00110" in base 2 and "10" in base 6. In the case of FIG. 22A, the true value is thought to be any one of 6, 7, 8, 9, or 10 in base 10. In this manner, the bubble error correction circuit 30C of the present embodiment corrects bubble errors to mitigate divergence from the true value.

Figure 23:
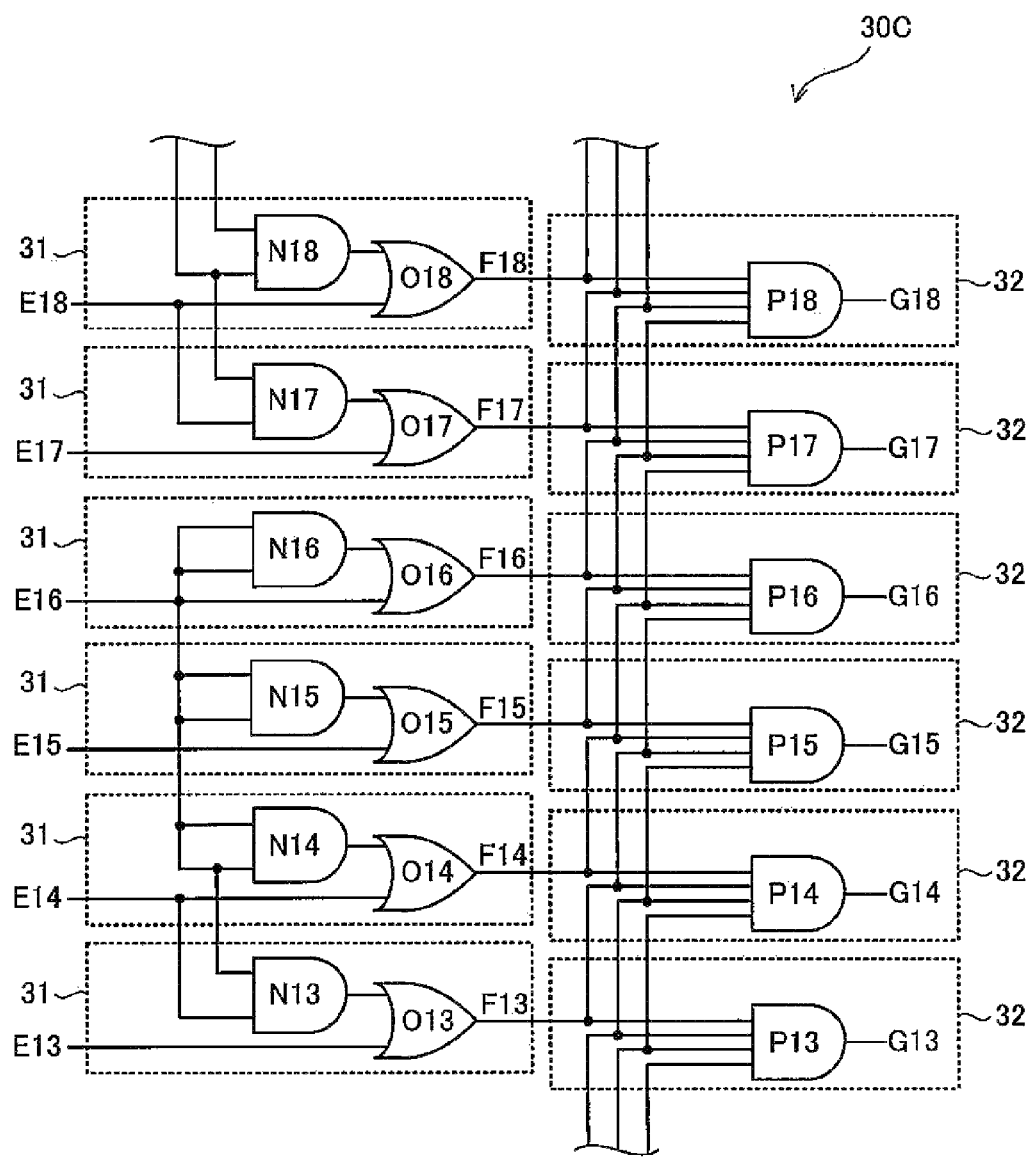
FIG. 23 is an equivalent circuit diagram of a bubble error correction circuit according to an embodiment of the present invention.

FIG. 23 shows an example of a configuration for a case of error correction in the bubble error correction circuit 30C in which the degree to which the relatively high reliability comparison signal E16, outputted from the high sensitivity comparator C16, contributes to error correction is even further increased. In the example shown in FIG. 23, the two input terminals of the AND circuit N16 are both connected to the output terminal of the high sensitivity comparator C16, and the comparison signal E16 is inputted to these two input terminals. In this manner, the comparison signal E16 is no longer corrected by other adjacent comparison signals at a higher step. Also, the two input terminals of the AND circuit N14 are both connected to the output terminal of the high sensitivity comparator C16, and the comparison signal E16 is inputted to these two input terminals. In this manner, the comparison signal E16 is prioritized over the comparison signal E14, which is two steps below the comparison signal E16. If the comparison signal E16 is prioritized over a comparison signal that is even further therebelow, then the comparison signal E16 should be inputted to the two input terminals of the AND circuit constituting the first correction circuit 31 that corrects the lower step comparison signal.

A case was illustrated in which, in the bubble error correction circuit 30C of the Embodiment 2 of the present invention, the comparison signals one step and two steps above the comparison signal to be corrected are used to correct the comparison signal to be corrected in the first correction circuit 31, and in the second correction circuit 32, the first correction signals one to three steps above the first correction signal to be corrected are used to correct the first correction signal to be corrected, but the configuration is not limited to to this aspect. In the first correction circuit 31, three or more comparison signals adjacent to and above the comparison signal to be corrected may be used to correct the comparison signal to be corrected. In such a case, the AND circuits N1 to N31 of the first correction circuit 31 would have three or more input terminals, and the three or more comparison signals adjacent to and above the comparison signal to be corrected would be inputted to the respective input terminals. Also, in the second correction circuit 32, two or four or more first correction signals below and adjacent to the first correction signal to be corrected may be used to correct the first correction signal to be corrected. In such a case, the AND circuits P1 to P31 of the second correction circuit 32 would have two or four or more input terminals, and the two or four or more first correction signals adjacent to and below the first correction signal to be corrected would be inputted to the respective input terminals. In the bubble error correction circuit 30C of the present embodiment, by increasing the number of signals, used for correction, adjacent to and above and below the signal to be corrected, it is possible to perform correction on bubble errors where three or more 0's are present between 1's in the thermometer code. In this manner, according to the bubble error correction circuit 30C of Embodiment 2 of the present invention, the range of bubble error correction can be expanded with ease.

Figure 24:
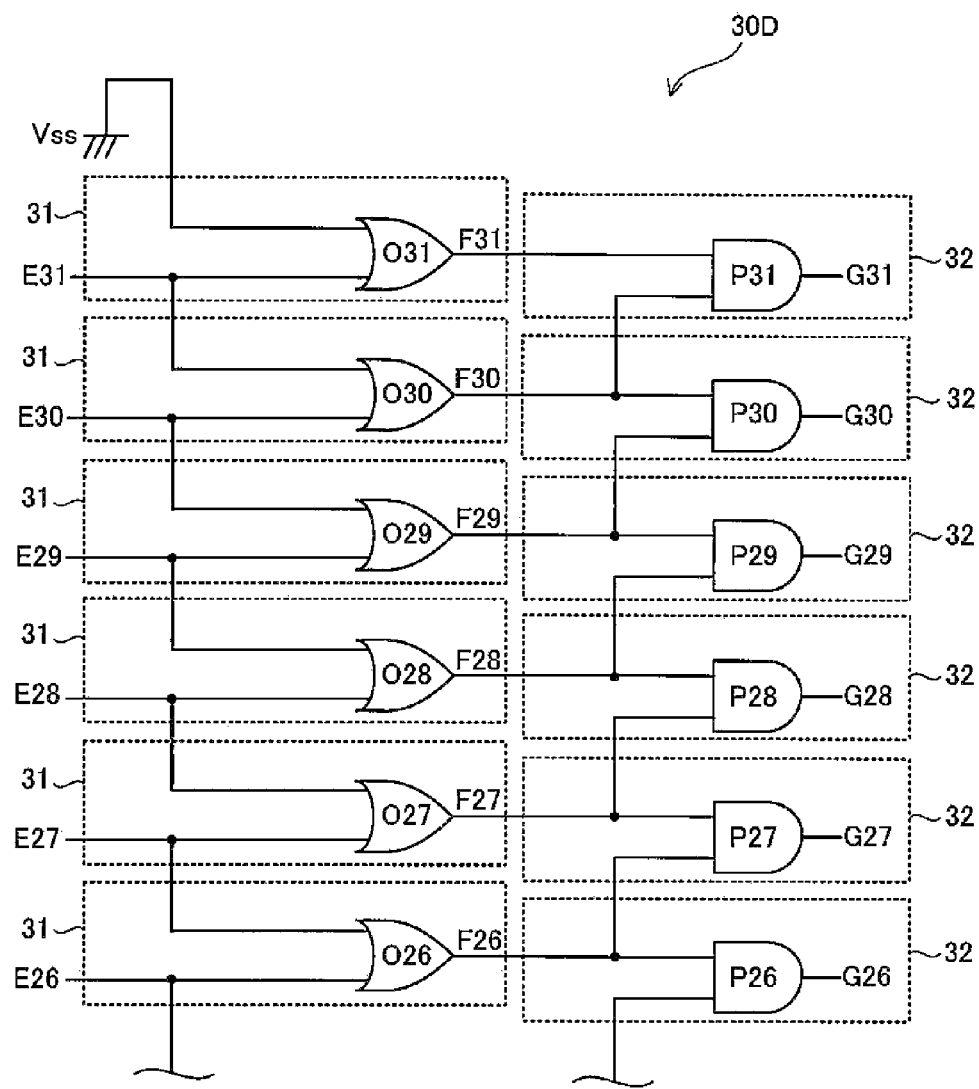
FIG. 24 is an equivalent circuit diagram of a bubble error correction circuit according to an embodiment of the present invention.

FIG. 24 shows a configuration of a bubble error correction circuit 30D according to a modification example. In FIG. 24, only portions of the bubble error correction circuit 30D where the comparison signals E26 to E31 are inputted are shown; other portions have similar configurations to portions already shown, and thus, those portions will not be mentioned.

The bubble error correction circuit 30D differs from the bubble error correction circuit 30C in that the first correction circuit 31 does not include AND circuits, and in that there are two input terminals for each AND circuit constituting the second correction circuit 32.

One input terminal of each of the OR circuits O26 to O31 of the first correction circuit 31 is connected to the output terminal of each of the corresponding comparators C26 to C31, and receives as input the corresponding comparison signal E26 to E31. The other input terminal of each of the OR circuits O26 to O31 is connected to the output terminal of each of the comparators disposed one step above the corresponding comparators C26 to C31, and receives as input the comparison signal outputted from the comparator disposed above. The comparison signal E28 outputted from the corresponding comparator C28 is inputted to the one input terminal of the OR circuit O28. The other input terminal of the OR circuit O28 receives as input the comparison signal E29 outputted from the comparator C29 disposed one step above the corresponding comparator C28, for example.

The one input terminal of each of the AND circuits P26 to P31 of the second correction circuit 32 is connected to the output terminal of each of the corresponding OR circuits O26 to O31, and receives as input the first correction signals F26 to F31 outputted from the corresponding OR circuit. The other input terminals of each of the AND circuits P26 to P30 are connected to the output terminal of each of the OR circuits disposed one step below the corresponding OR circuits O26 to O30, and receive as input the first correction signals outputted from the lower step OR circuits. The first correction signal F28 outputted from the corresponding OR circuit O28 is inputted to the one input terminal of the AND circuit P28. The other input terminal of the AND circuit P28 receives as input the first correction signal F27 outputted from the OR circuit O27 disposed one step below the corresponding OR circuit O28, for example.

In the bubble error correction circuit 30D, the comparison signal one step above the comparison signal to be corrected is used to correct the comparison signal to be corrected in the first correction circuit 31, and in the second correction circuit 32, the first correction signal one step below the first correction signal to be corrected is used to correct the first correction signal to be corrected.

According to the bubble error correction circuit 30D, it is possible to perform correction on bubble errors that are most likely to occur (bubble errors in which one "0" is present between "1's"). Additionally, it is possible to reduce the scale of the circuit even more than in the bubble error correction circuit 30C.

What is claimed is:

1. A semiconductor device, comprising:
    a comparison circuit configured to compare an input analog voltage with a plurality of reference voltages, which are arranged in an ascending order of voltage level, to thereby obtain a plurality of comparison signals arranged in an order corresponding to the order of the reference voltages;
    a first correction circuit configured to correct each of the comparison signals using another one of the comparison signals that is adjacent to said each comparison signal at a first side thereof, to thereby output a plurality of first correction signals arranged in an order corresponding to the order of the comparison signals; and
    a second correction circuit configured to correct each of the first correction signals using another one of first correction signals that is adjacent to said each first correction signal at a second side thereof, to thereby output a plurality of second correction signals, the second side being different from the first side.

2. The semiconductor device according to claim 1, wherein
    the first correction circuit is configured to correct said each comparison signal using said another comparison signal and yet another one of the comparison signals that is adjacent to said another comparison signal at the first side of said another comparison signal.

3. The semiconductor device according to claim 1, wherein
    the second correction circuit is configured to correct said each first correction signal using said another first correction signal and yet another one of first correction signals that is adjacent to said another first correction signal at the second side of said another first correction signal.

4. The semiconductor device according to claim 1, further comprising:
    a reference voltage generation circuit configured to generate the plurality of reference voltages, including at least two first references voltages and at least two second references voltages, the first reference voltages having a first difference between each adjacent two reference voltages thereof, the second reference voltages having a second difference between each adjacent two reference voltages thereof, the first difference being greater than the second difference.

5. The semiconductor device according to claim 4, wherein
    the comparison circuit includes a plurality of comparators respectively corresponding to the plurality of reference voltages, each of the comparators having two input terminals through which the reference voltage corresponding thereto and the input analog voltage are respectively inputted, and at least one of the comparators to which one of the second reference voltages has a higher sensitivity than the other comparators.

6. The semiconductor device according to claim 5, wherein the first correction circuit is configured to prioritize ones of the comparison signals outputted by the at least one comparator having the higher sensitivity during the correction of the comparison signals.

7. The semiconductor device according to claim 1, further comprising:

an encoding circuit configured to convert a thermometer code, indicated by the plurality of comparison signals corrected by the first correction circuit and the second correction circuit, into a binary code.

8. The semiconductor device according to claim 1, wherein the comparison circuit includes a plurality of comparators respectively corresponding to the plurality of reference voltages, each comparator being configured to compare the input analog voltage with the corresponding reference voltage to output one of the comparison signals.

9. The semiconductor device according to claim 8 wherein the first correction circuit includes a plurality of circuits each of which receives one of the comparison signals as a target comparison signal for correction, each of the plurality of the circuits including an OR gate and an AND gate, the OR gate being configured to perform an OR operation on first and second comparison signals to output a first signal, the first comparison signal being adjacent to the target comparison signal in a lower side thereof with respect to the ascending order, the second comparison signal being adjacent to the first comparison signal in the lower side thereof, the AND gate being configured to receive the target comparison signal and to perform an AND operation on the target comparison signal and the first signal to output one of the first correction signals; and the second correction circuit includes a plurality of OR gates respectively corresponding to a plurality of AND gates in the first correction circuit, each of the plurality of OR gates being configured to perform an OR operation on the one first correction signal and another one of the first correction signals adjacent to the one first correction signal on a higher side thereof with respect to the ascending order to output one of the second correction signals.

10. The semiconductor device according to claim 8 wherein the first correction circuit includes a plurality of circuits each of which receives one of the comparison signals as a target comparison signal for correction, each of the plurality of the circuits including an OR gate and a NAND gate, the OR gate being configured to perform an OR operation on first and second comparison signals to output a first signal, the first comparison signal being adjacent to the target comparison signal in a lower side thereof with respect to the ascending order, the second comparison signal being adjacent to the first comparison signal in the lower side thereof, the NAND gate being configured to receive the target comparison signal and to perform a NAND operation on the target comparison signal and the first signal to output one of the first correction signals; and the second correction circuit includes a plurality of NAND gates respectively corresponding to a plurality of NAND gates in the first correction circuit, each of the plurality of NAND gates being configured to perform a NAND operation on the one first correction signal and another one of first correction signals adjacent to the one first correction signal in a higher side thereof with respect to the ascending order to output one of the second correction signals.

11. The semiconductor device according to claim 8 wherein the first correction circuit includes a plurality of circuits each of which receives one of the comparison signals as a target comparison signal for correction, each of the plurality of circuits including an AND gate and an OR gate, the AND gate being configured to perform an AND operation on first and second comparison signals to output a first signal, the first comparison signal being adjacent to the target comparison signal in a higher side thereof with respect to the ascending order, the second comparison signal being adjacent to the first signal in the higher side thereof, the OR gate being configured to receive the target comparison signal and to perform an OR operation on the target comparison signal and the first comparison signal to output one of the first correction signals; and the second correction circuit includes a plurality of AND gates respectively corresponding to a plurality of OR gates in the first correction circuit, each of the plurality of AND gates being configured to perform an AND operation on the one first correction signal and another one of first correction signals adjacent to the one first correction signal in a lower side thereof with respect to the ascending order to output one of the second correction signals.

12. The semiconductor device according to claim 8, wherein the first correction circuit includes a plurality of AND gates each of which receives one of the comparison signals as a target comparison signal for correction, each of the plurality of AND gates being configured to receive the target comparison signal and to perform an AND operation on the target comparison signal and another one of the comparison signals adjacent to the target comparison signal in a lower side thereof with respect to the ascending order to output one of the first correction signals; and the second correction circuit includes a plurality of OR gates respectively corresponding to the plurality of AND gates, each of the plurality of OR gates being configured to perform an OR operation on the one first correction signal and another one of the first correction signals adjacent to the one first correction signal at a higher side thereof with respect to the ascending order to output one of the second correction signals.

13. The semiconductor device according to claim 8 wherein the first correction circuit includes a plurality of OR gates each of which receives one of the comparison signals as a target comparison signal for correction, each of the plurality of OR gates being configured to receive the target comparison signal and to perform an OR operation on the target comparison signal and another one of the comparison signals adjacent to the target comparison signal in a higher side thereof with respect to the ascending order to output one of the first correction signals; and the second correction circuit includes a plurality of AND gates respectively corresponding to the plurality of OR gates, each of the plurality of AND gates being configured to perform an AND operation on the one first correction signal and another one of the first correction signals adjacent to the one first correction signal at a lower side thereof with respect to the ascending order to output one of the second correction signals.

14. An error correcting method, comprising:

comparing an input analog voltage with a plurality of reference voltages, which are arranged in an ascending order of voltage level, to thereby obtain a plurality of comparison signals arranged in an order corresponding to the order of the reference voltages;

performing first correction on each of the comparison signals using another one of the comparison signals that is adjacent to said each comparison signal at a first side thereof with respect to the ascending order, to thereby output a plurality of first correction signals arranged in an order corresponding to the order of the comparison signals; and performing second correction on each of the first correction signals using another one of first correction signals that is adjacent to said each first correction signal at a second side thereof with respect to the ascending order, to thereby output a plurality of second correction signals, the second side being different from the first side.

15. The semiconductor device according to claim 1, wherein the first and second correction circuits constitute a correction circuit for correcting bubble errors included in the plurality of comparison signals.

16. The error correcting method according to claim 14, wherein the first and second corrections are performed for correcting bubble errors included in the plurality of comparison signals.

* * * * *